United States Patent
Nandakumar et al.

(10) Patent No.: US 12,317,583 B2
(45) Date of Patent: *May 27, 2025

(54) SEMICONDUCTOR DEVICE WITH LOW NOISE TRANSISTOR AND LOW TEMPERATURE COEFFICIENT RESISTOR

(71) Applicant: Texas Instruments Incorporated, Dallas, TX (US)

(72) Inventors: Mahalingam Nandakumar, Richardson, TX (US); Yanbiao Pan, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/317,227

(22) Filed: May 15, 2023

(65) Prior Publication Data

US 2023/0290775 A1    Sep. 14, 2023

Related U.S. Application Data

(63) Continuation of application No. 17/086,421, filed on Nov. 1, 2020, now Pat. No. 11,676,961.

(51) Int. Cl.
*H10D 84/80*    (2025.01)
*H10D 84/01*    (2025.01)
*H10D 84/03*    (2025.01)

(52) U.S. Cl.
CPC ......... *H10D 84/811* (2025.01); *H10D 84/013* (2025.01); *H10D 84/0135* (2025.01); *H10D 84/038* (2025.01)

(58) Field of Classification Search
CPC ............... H01L 27/0629; H01L 27/088; H01L 21/823418; H01L 21/823437; H10D 84/811; H10D 84/013; H10D 84/0135; H10D 84/038; H02K 15/90; A01G 13/33; A23B 2/783; H10F 77/955
See application file for complete search history.

(56) References Cited

U.S. PATENT DOCUMENTS

| 5,714,788 A | 2/1998 | Ngaoaram |
| 5,821,157 A | 10/1998 | Lee et al. |
| 6,140,910 A | 10/2000 | Smith et al. |

(Continued)

*Primary Examiner* — Dale E Page
*Assistant Examiner* — Quovaunda Jefferson
(74) *Attorney, Agent, or Firm* — Yudong Kim; Frank D. Cimino

(57) ABSTRACT

A semiconductor device includes a resistor having a resistor body including polysilicon, with fluorine in the polysilicon. The resistor body has a laterally alternating distribution of silicon grain sizes. The semiconductor device further includes an MOS transistor having a gate including polysilicon with fluorine. The fluorine in the gate has a higher average concentration than the fluorine in the resistor body. The semiconductor device may be formed by forming a gate/resistor layer including polysilicon. A fluorine implant mask is formed over the gate/resistor layer, exposing the gate/resistor layer in an area for the gate and over implant segments in an area for the resistor body. The implant segments do not cover the entire area for the resistor body. Fluorine is implanted into the gate/resistor layer where exposed by the fluorine implant mask. The gate/resistor layer is patterned to form the gate and the resistor body.

26 Claims, 20 Drawing Sheets

(56) References Cited

U.S. PATENT DOCUMENTS

| | | | |
|---|---|---|---|
| 6,670,263 B2 * | 12/2003 | Ballantine | H01L 29/4925 |
| | | | 438/585 |
| 7,018,880 B2 | 3/2006 | Hao et al. | |
| 8,076,228 B2 | 12/2011 | Berthold et al. | |
| 9,991,120 B2 | 6/2018 | Montgomery et al. | |
| 11,676,961 B2 * | 6/2023 | Nandakumar | H01L 27/0629 |
| | | | 257/64 |
| 2005/0136579 A1 | 6/2005 | Hao et al. | |
| 2007/0096183 A1 | 5/2007 | Ogawa et al. | |
| 2021/0125872 A1 | 4/2021 | Nandakumar | |
| 2021/0408221 A1 | 12/2021 | Nandakumar | |

* cited by examiner

US 12,317,583 B2

1

SEMICONDUCTOR DEVICE WITH LOW NOISE TRANSISTOR AND LOW TEMPERATURE COEFFICIENT RESISTOR

CROSS-REFERENCE TO RELATED APPLICATIONS

The present application is a continuation of U.S. patent application Ser. No. 17/086,421, filed on Nov. 1, 2020, the contents of which are herein incorporated by reference in its entirety.

TECHNICAL FIELD

This disclosure relates to the field of semiconductor devices. More particularly, but not exclusively, this disclosure relates to polycrystalline silicon resistors in semiconductor devices.

BACKGROUND OF THE INVENTION

Some semiconductor devices include resistors of polycrystalline silicon, commonly referred to as polysilicon. Polysilicon resistors have some advantages, such as tunable sheet resistance, attained by varying dopant concentrations in the polysilicon. Polysilicon resistors have temperature coefficients, which are relative changes in resistance as a function of temperature, that range from −200 parts per million per degree Centigrade (ppm/° C.) to +250 ppm/° C. It is sometimes desirable to attain a specific temperature coefficient in a polysilicon resistor; doing so undesirably increases process complexity and fabrication cost for the semiconductor device.

SUMMARY OF THE INVENTION

The present disclosure introduces a semiconductor device including a resistor having a resistor body including polycrystalline silicon, referred to herein as polysilicon. The resistor body includes fluorine in the polysilicon. The resistor body has a laterally alternating distribution of silicon grain sizes. The semiconductor device further includes a metal oxide semiconductor (MOS) transistor having a gate including polysilicon. The polysilicon of the gate includes fluorine with a higher average concentration than the polysilicon of the resistor body.

The semiconductor device may be formed by forming a gate/resistor layer including polysilicon over a substrate of the semiconductor device. A fluorine implant mask is formed over the gate/resistor layer, exposing the gate/resistor layer in an area for the gate and over implant segments in an area for the resistor body. The implant segments do not cover the entire area for the resistor body. Fluorine is implanted into the gate/resistor layer where exposed by the fluorine implant mask. The gate/resistor layer is patterned to form the gate and the resistor body. The semiconductor device is heated to diffuse the fluorine throughout the resistor body.

DETAILED DESCRIPTION

Figure 1A:
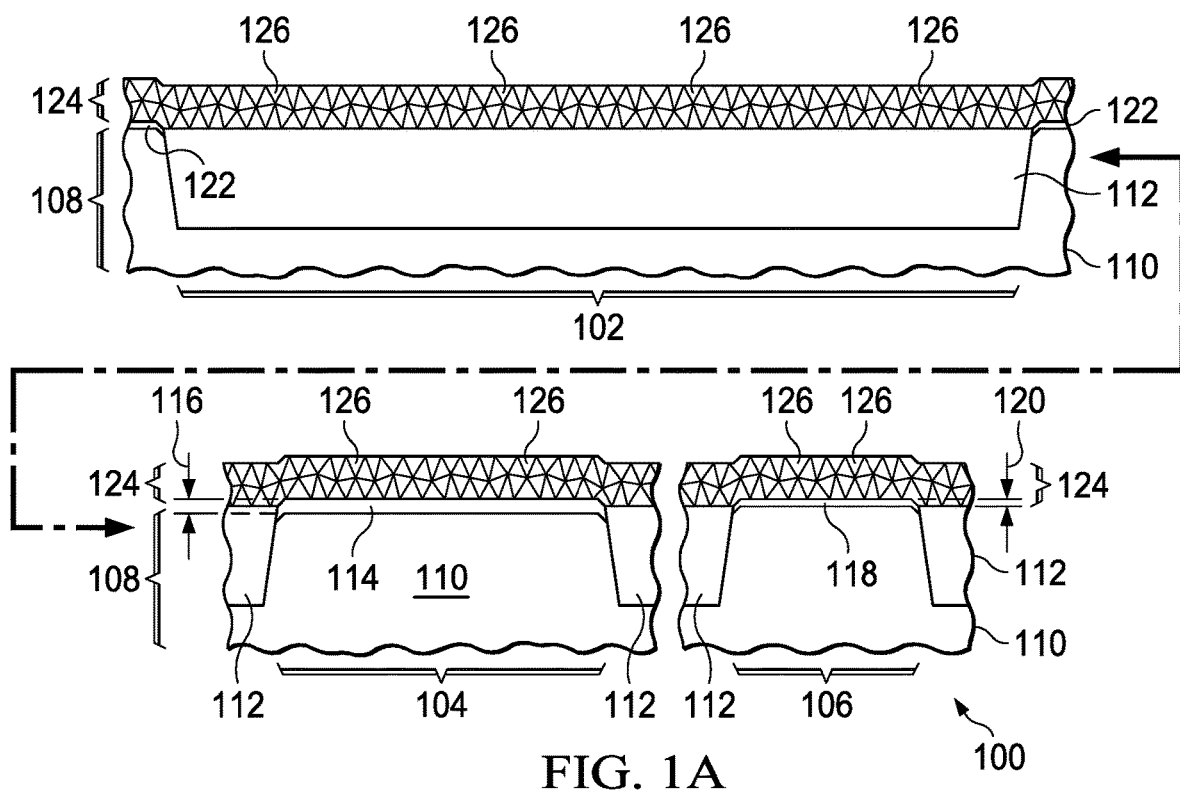
FIG. 1A through FIG. 1L are cross sections of a semiconductor device including a resistor, a first MOS transistor, and a second MOS transistor, depicted in an example method of formation.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

A semiconductor device is formed on a substrate including a semiconductor material. The semiconductor device includes a metal oxide semiconductor (MOS) transistor and a resistor. The MOS transistor includes a gate dielectric layer formed on the semiconductor material, and a gate on the gate dielectric layer. The gate includes polycrystalline silicon, referred to herein as polysilicon. Polysilicon has grains of monocrystalline silicon, less than 10 microns in size, randomly oriented with respect to each other. Surfaces of the grains of monocrystalline silicon are referred to as grain boundaries; adjacent grains contact each other at the grain boundaries. The resistor has a resistor body including polysilicon. The polysilicon of the gate includes fluorine, and the polysilicon of the resistor body includes fluorine. The resistor body has a lower average concentration of fluorine than the gate.

A method of forming the semiconductor device includes forming a gate/resistor layer including polysilicon over the substrate of the semiconductor device. A fluorine implant mask is formed over the gate/resistor layer. The fluorine implant mask exposes the gate/resistor layer in an area for the gate of the MOS transistor, and exposes the gate/resistor layer over implant segments in an area for the resistor body. The implant segments do not cover the area for the resistor body, and the implant segments are laterally separated by portions of the gate/resistor layer covered by the fluorine implant mask, so that the fluorine implant mask exposes a fraction of the area for the resistor body, the fraction being less than 100 percent. Fluorine is implanted into the gate/resistor layer where exposed by the fluorine implant mask. The implanted fluorine amorphizes the polysilicon in a top layer of the polysilicon where exposed by the fluorine implant mask. The gate/resistor layer is patterned to form the gate and the resistor body. The semiconductor device is heated, causing the amorphized polysilicon to recrystallize; the implanted fluorine causes the recrystallized polysilicon to have smaller grains than the polysilicon that was not implanted with the fluorine. Thus, the implant segments have smaller grains than the polysilicon between the implant segments, producing a laterally alternating distribution of silicon grain sizes in the resistor body. When the semiconductor device is heated, the fluorine diffuses in the polysilicon. In the resistor body, the fluorine diffuses from the polysilicon that was implanted with the fluorine into the polysilicon that was not implanted with the fluorine, resulting in a fluorine concentration in the polysilicon that was not implanted that is at least 95 percent of a fluorine concentration in the polysilicon that was implanted. The fluorine in the gate is also uniformly distributed.

Dopants are introduced into the resistor body and the gate to provide a desired electrical conductivity. The dopants may include p-type dopants, such as boron, and may include n-type dopants such as phosphorus and arsenic. A portion of the dopants may be distributed throughout interiors of the grains of monocrystalline silicon, generating free charge carriers such as holes, for p-type dopants, and electrons, for n-type dopants. Electrical current that flows through the interiors of the grains is similar to electrical current that flows through doped monocrystalline silicon, in that a primary component of resistance is scattering of the free charge carriers by lattice defects in the interiors of the grains. Scattering cross sections of these lattice defects increases with increasing temperature, resulting in higher resistance with increasing temperature of the polysilicon, producing a positive temperature coefficient of resistance for the electrical current that flows through the interiors of the grains.

The temperature coefficient of resistance is a change in resistance for a 1 degree Centigrade (° C.) increase in temperature from an initial temperature, divided by the resistance at the initial temperature. The initial temperature is frequently set at 20° C. The temperature coefficient of resistance is frequently expressed in parts per million per degree Centigrade (ppm/° C.). The temperature coefficient of resistance can be positive, in which case the resistance increases when the temperature rises, or negative, in which case the resistance decreases when the temperature rises. In an example, a resistor having a resistance of 1000 ohms at 20° C. and a temperature coefficient of resistance of +100 ppm/° C., would have a change of the resistance at 25° C. of $[+100 \times 10^{-6} (1/° C.)] \times [1000 (ohms)] \times [5 (° C.)] = +0.5$ ohms. In another example, a resistor having a resistance of 5000 ohms at 20° C. and a temperature coefficient of resistance of −200 ppm/° C., would have a change of the resistance at 30° C. of $[-200 \times 10^{-6} (1/° C.)] \times [5000 (ohms)] \times [10 (° C.)] = -10$ ohms. In a further example, a resistor having a resistance of 10000 ohms at 20° C. and a temperature coefficient of resistance of 0 ppm/° C., would have a change of the resistance at 30° C. of $[0 \times 10^{-6} (1/° C.)] \times [10000 (ohms)] \times [10 (° C.)] = 0$ ohms, that is no change in the resistance.

Another portion of the dopants may be accumulated at the grain boundaries, generating heavily doped regions less than 1 micron wide. P-type heavily doped regions produce valence band wells that accumulate holes. N-type heavily doped regions produce conduction band wells that accumulate electrons. Electrical current flowing across the heavily doped regions requires thermal energy to move the free charge carriers out of the band wells. As temperature of the polysilicon increases, more thermal energy is available, so that more free charge carriers are raised out of the band wells, which reduces electrical resistance. Thus, the electrical current flowing across the heavily doped regions has a negative temperature coefficient of resistance. A temperature coefficient of resistance for the resistor body includes contributions from the positive temperature coefficient of resistance from the interiors of the grains and the negative temperature coefficient of resistance from the grain boundaries. The temperature coefficient of resistance for the resistor body depends on how much of the dopants is distributed throughout the interiors of the grains and how much of the dopants is accumulated at the grain boundaries.

The fluorine in the resistor body displaces some of the dopants from the grain boundaries into the interiors of the grains, thereby increasing the contribution of the positive temperature coefficient from the interiors of the grains and decreasing the contribution of the negative temperature coefficient from the grain boundaries. Thus, the fluorine in the resistor body increases the temperature coefficient of resistance for the resistor body. The temperature coefficient of resistance may be adjusted by adjusting an amount of fluorine in the resistor body.

In the gate, a portion of the fluorine accumulates at an interface between the polysilicon of the gate and the gate dielectric layer. The fluorine at the interface bonds with silicon and reduces noise in the MOS transistor.

It is noted that terms such as top, bottom, over, and under may be used in this disclosure. These terms should not be construed as limiting the position or orientation of a structure or element, but should be used to provide spatial relationship between structures or elements. For the purposes of this disclosure, the terms "lateral" and "laterally" refer to a direction parallel to a plane of the top surface of the semiconductor material.

FIG. 1A through FIG. 1L are cross sections of a semiconductor device 100 including a resistor 102, a first MOS transistor 104, and a second MOS transistor 106, depicted in an example method of formation. In this example, the first MOS transistor 104 is described as an n-channel first MOS transistor 104, and the second MOS transistor 106 is described as an n-channel second MOS transistor 106. In alternate versions of this example, the first MOS transistor 104 may be implemented as a p-channel first MOS transistor 104, or the second MOS transistor 106 may be implemented as a p-channel second MOS transistor 106, or both the first MOS transistor 104 and the second MOS transistor 106 may be implemented as p-channel MOS transistors 104 and 106. The semiconductor device 100 is formed on a substrate 108. The substrate 108 may be implemented as a bulk semiconductor wafer, or a silicon-on-insulator (SOI) wafer, by way of example. The substrate 108 includes a semiconductor material 110. The semiconductor material 110 may include monocrystalline silicon, and may be implemented as an upper portion of a bulk silicon wafer, a silicon epitaxial layer, or a silicon film of an SOI wafer, for example. Field oxide 112 may be formed in the substrate 108. The field oxide 112 may include silicon dioxide or silicon dioxide-based dielectric material. In this example, the field oxide 112 extends under the resistor 102, and laterally isolates the first MOS transistor 104 and the second MOS transistor 106. For the purposes of this disclosure, the term "laterally" refers to a direction parallel to a plane of a top surface of the semiconductor material 110, that is, the surface of the semiconductor material 110 extending through the first MOS transistor 104 and the second MOS transistor 106. The field oxide 112 may be formed by a shallow trench isolation (STI) process, which includes forming an isolation trench in the semiconductor material 110, filling the isolation trench with the silicon dioxide or silicon dioxide-based dielectric material, and removing the silicon dioxide or silicon dioxide-based dielectric material from over the semiconductor material 110 adjacent to the isolation trench. The field oxide 112 may then have an STI configuration, which includes straight sidewalls in the semiconductor material 110, inclined at 80 degrees to 90 degrees to the top surface of the semiconductor material 110, and being coplanar with the top surface within 100 nanometers. FIG. 1A depicts the field oxide 112 having an STI configuration. In an alternate version of this example, the field oxide 112 may be formed by a local oxidation of silicon (LOCOS) process, which includes patterning a masking layer, such as a silicon nitride layer, to expose the semiconductor material 110 in an area for the field oxide 112. Silicon dioxide is formed by a thermal oxidation process on the semiconductor material 110 where exposed by the masking layer, to form the field oxide 112. The silicon dioxide extends partway under edges of the masking layer to form a tapered edge of the field oxide 112, commonly referred to as a bird's beak.

A first gate dielectric layer 114 is formed on the semiconductor material 110 in an area for the first MOS transistor 104. The first gate dielectric layer 114 may include silicon dioxide, formed by a thermal oxidation process. The first gate dielectric layer 114 may include nitrogen, added by exposure to a nitrogen plasma, to improve dielectric reliability of the first gate dielectric layer 114. The first gate dielectric layer 114 may further include one or more additional dielectric materials, such as hafnium oxide, zirconium oxide, or tantalum oxide, to increase a dielectric constant of the first gate dielectric layer 114. Other compositions of the first gate dielectric layer 114 are within the scope of this example. In this example, the first gate dielectric layer 114 may have a first thickness 116 of 2 nanometers to 10 nanometers.

A second gate dielectric layer 118 is formed on the semiconductor material 110 in an area for the second MOS transistor 106. The second gate dielectric layer 118 may have a composition similar to the first gate dielectric layer 114, as a result of being formed concurrently, or may have a different composition. In this example, the second gate dielectric layer 118 may have a second thickness 120 of 2 nanometers to 10 nanometers. The second thickness 120 may be equal to the first thickness 116, as a result of being formed concurrently, or may be less than the first thickness 116.

In one version of this example, the first MOS transistor 104 may be implemented in an analog circuit, and the second MOS transistor 106 may be implemented in a logic circuit, with the first MOS transistor 104 operating at a first drain-source potential that is higher than a second drain-source potential employed to operate the second MOS transistor 106. In another version of this example, the first MOS transistor 104 may be implemented in a low-noise analog circuit, and the second MOS transistor 106 may be implemented in a high speed analog circuit, with the first MOS transistor 104 operating at a first drain-source potential that is equal to, or higher than, a second drain-source potential employed to operate the second MOS transistor 106.

A third gate dielectric layer 122 may be formed over other areas of the semiconductor material 110, such as areas adjacent to the area for the resistor 102. The third gate dielectric layer 122 may be formed concurrently with either the first gate dielectric layer 114 or the second gate dielectric layer 118, or may be formed separately.

A gate/resistor layer 124 is formed on the field oxide 112, the first gate dielectric layer 114, the second gate dielectric layer 118, and the third gate dielectric layer 122. The gate/resistor layer 124 includes polysilicon, and may include dopants, such as boron or phosphorus. The gate/resistor layer 124 may have a thickness of 50 nanometers to 1 micron, by way of example. The gate/resistor layer 124 may be formed by a chemical vapor deposition (CVD) process that includes thermal decomposition of silane or disilane at 550° C. to 650° C. and 100 millitorr to 500 millitorr pressure. Dopant gases, such as borane or phosphine, may be introduced with the silane or disilane to add dopants, boron or phosphorus, respectively, to the gate/resistor layer 124.

The gate/resistor layer 124 includes grains 126 of monocrystalline silicon. Adjacent grains 126 contact each other at grain boundaries, which are surfaces of the grains 126.

Figure 1B:
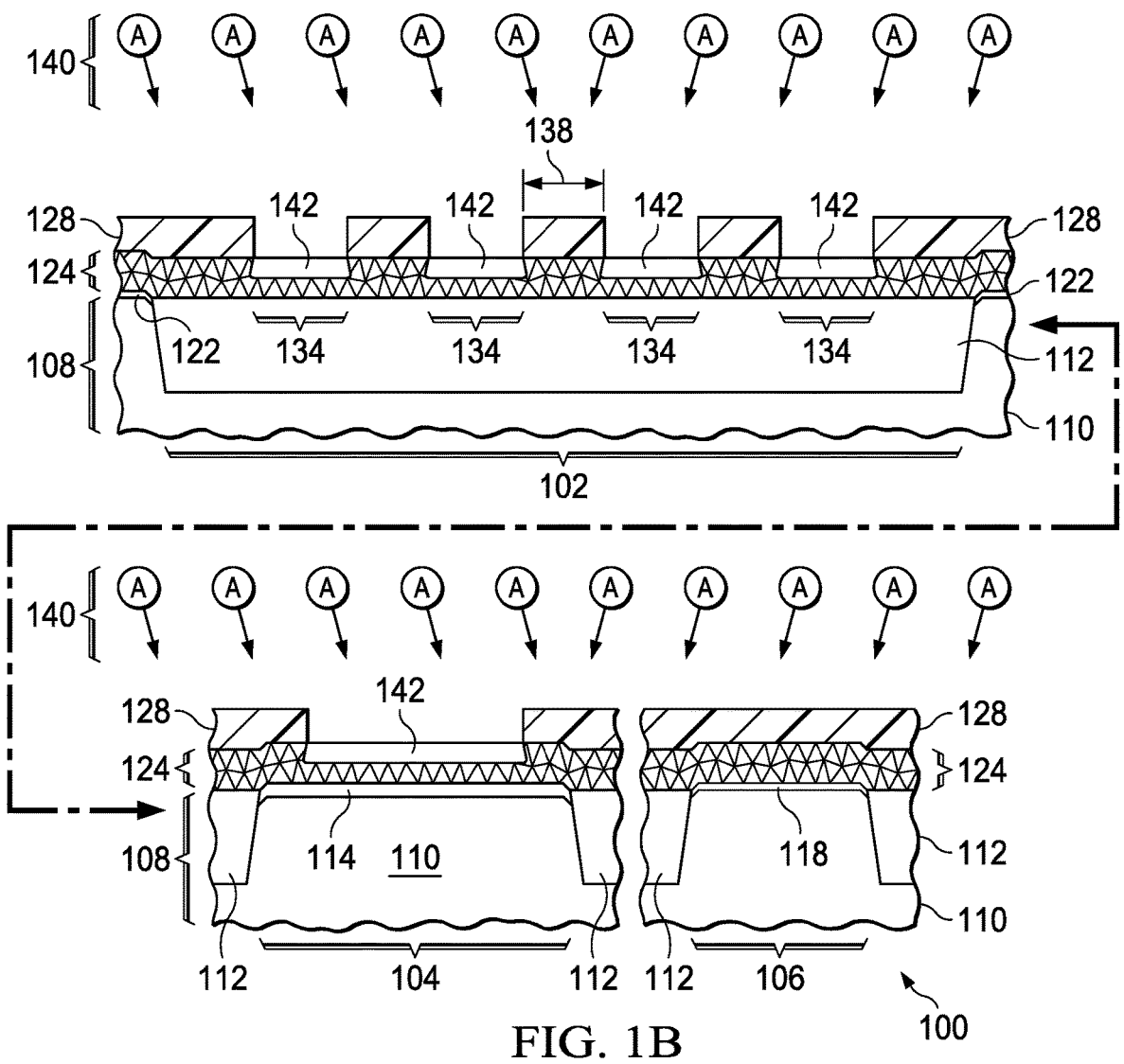

Referring to FIG. 1B, a fluorine implant mask 128 is formed over the gate/resistor layer 124. The fluorine implant mask 128 may include photoresist and may be formed by a photolithographic process. The fluorine implant mask 128 may further include anti-reflection material, such as a bottom anti-reflection coat (BARC) under the photoresist. The fluorine implant mask 128 exposes the gate/resistor layer 124 in an area for a subsequently-formed first gate 130, shown in FIG. 1E, of the first MOS transistor 104. The fluorine implant mask 128 may expose all of the area for the first gate 130, as indicated in FIG. 1B, to maximize an amount of fluorine in the first gate 130. The fluorine implant mask 128 covers the gate/resistor layer 124 in an area for a subsequently-formed second gate 132, shown in FIG. 1E, of the second MOS transistor 106. The fluorine implant mask 128 exposes the gate/resistor layer 124 over implant segments 134 of a subsequently-formed resistor body 136, shown in FIG. 1E, of the resistor 102. The implant segments 134 do not completely cover the resistor body 136; the implant segments 134 may occupy 25 percent to 75 percent of the resistor body 136, for example. The implant segments 134 are laterally separated by portions of the gate/resistor layer 124 that are covered by the fluorine implant mask 128. The fluorine implant mask 128 has separation widths 138 between adjacent instances of the implant segments 134; the separation width 138 may be less than 1 micron, to advantageously enable diffusion of fluorine throughout the resistor body 136.

In this example, an amorphizing species 140, labeled as "A" in FIG. 1B, is implanted into the gate/resistor layer 124 where exposed by the fluorine implant mask 128. The amorphizing species 140 may be referred to as a pre-amorphization implant (PAI) species, and the process of implanting the amorphizing species 140 may be referred to as the PAI. The amorphizing species 140 may include silicon, germanium, indium, or antimony, for example. Other amorphizing species are within the scope of this example. The amorphizing species 140 may be implanted at a total dose of $1\times10^{14}$ cm$^{-2}$ to $5\times10^{15}$ cm$^{-2}$, by way of example. The amorphizing species 140 amorphizes the polysilicon in the gate/resistor layer 124, to form amorphous silicon regions 142 in the gate/resistor layer 124 where exposed by the fluorine implant mask 128, in the implant segments 134 and in the area for the first gate 130. The amorphous silicon regions 142 may extend partway in the gate/resistor layer 124 toward the substrate 108, as depicted in FIG. 1B. Amorphizing the polysilicon in the gate/resistor layer 124 may assist diffusion of subsequently-implanted fluorine in the resistor body 136 between the implant segments 134. The amorphizing species 140 may be implanted at a tilt angle of 20 degrees to 40 degrees, to extend the amorphous silicon regions 142 under the fluorine implant mask 128 and thereby increase diffusion of subsequently-implanted fluorine in the resistor body 136 between the implant segments 134.

Figure 1C:
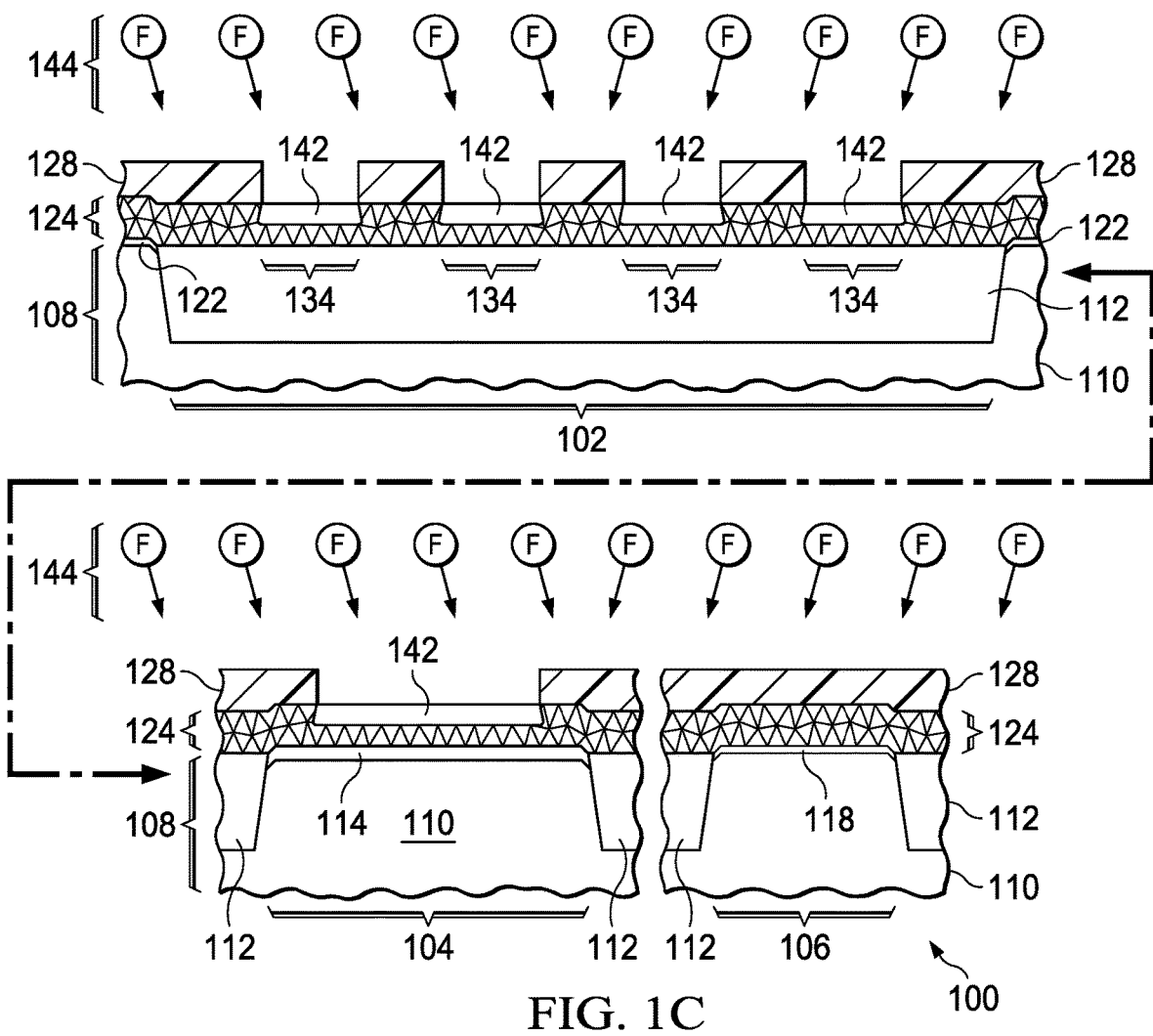

Referring to FIG. 1C, a first dose of fluorine 144, labeled as "F" in FIG. 1C, is implanted into the gate/resistor layer 124 where exposed by the fluorine implant mask 128. The first dose of fluorine 144 may be implanted at a first total dose to attain a desired noise level in the first MOS transistor 104. The first total dose depends on the thickness of the gate/resistor layer 124. By way of example, for a thickness of the gate/resistor layer 124 between 150 nanometers and 200 nanometers, the first total dose may be between $4 \times 10^{15}$ cm$^{-2}$ to $8 \times 10^{15}$ cm$^{-2}$. The resistor body 136 receives an effective fluorine dose of the first dose of fluorine 144 that is less than the total dose due to the portions of the fluorine implant mask 128 covering the gate/resistor layer 124 between the implant segments 134. The effective fluorine dose may be estimated as a product of the total dose and a ratio of a combined area of the implant segments 134 to the area of the resistor body 136. As an example, for a value of the total dose of $6 \times 10^{15}$ cm$^{-2}$ and a value of the ratio of the combined area of the implant segments 134 to the area of the resistor body 136 of 0.5, the effective fluorine dose may be estimated at $3 \times 10^{15}$ cm$^{-2}$. The ratio of the combined area of the implant segments 134 to the area of the resistor body 136 may be selected to attain an effective fluorine dose to provide a desired temperature coefficient of resistance in the resistor body 136. The first dose of fluorine 144 may be implanted at a tilt angle of 20 degrees to 40 degrees, to extend the implanted first dose of fluorine 144 under the fluorine implant mask 128 and thereby increase diffusion of subsequently-implanted fluorine in the resistor body 136 between the implant segments 134.

In an alternate version of this example, the amorphizing species 140 of FIG. 1B may be implanted at a lower dose, so that the amorphous silicon regions 142 are not formed until the first dose of fluorine 144 is implanted. Reducing the dose of the amorphizing species 140 may reduce a fabrication cost of the semiconductor device 100.

After the first dose of fluorine 144 is implanted into the gate/resistor layer 124, the fluorine implant mask 128 may be removed. Photoresist and other organic material in the fluorine implant mask 128 may be removed by an asher process using oxygen radicals, followed by a wet clean process using an aqueous mixture of sulfuring acid and hydrogen peroxide, or an aqueous mixture of ammonium fluoride and hydrogen peroxide. Other methods for removing the fluorine implant mask 128 are within the scope of this example.

Figure 1D:
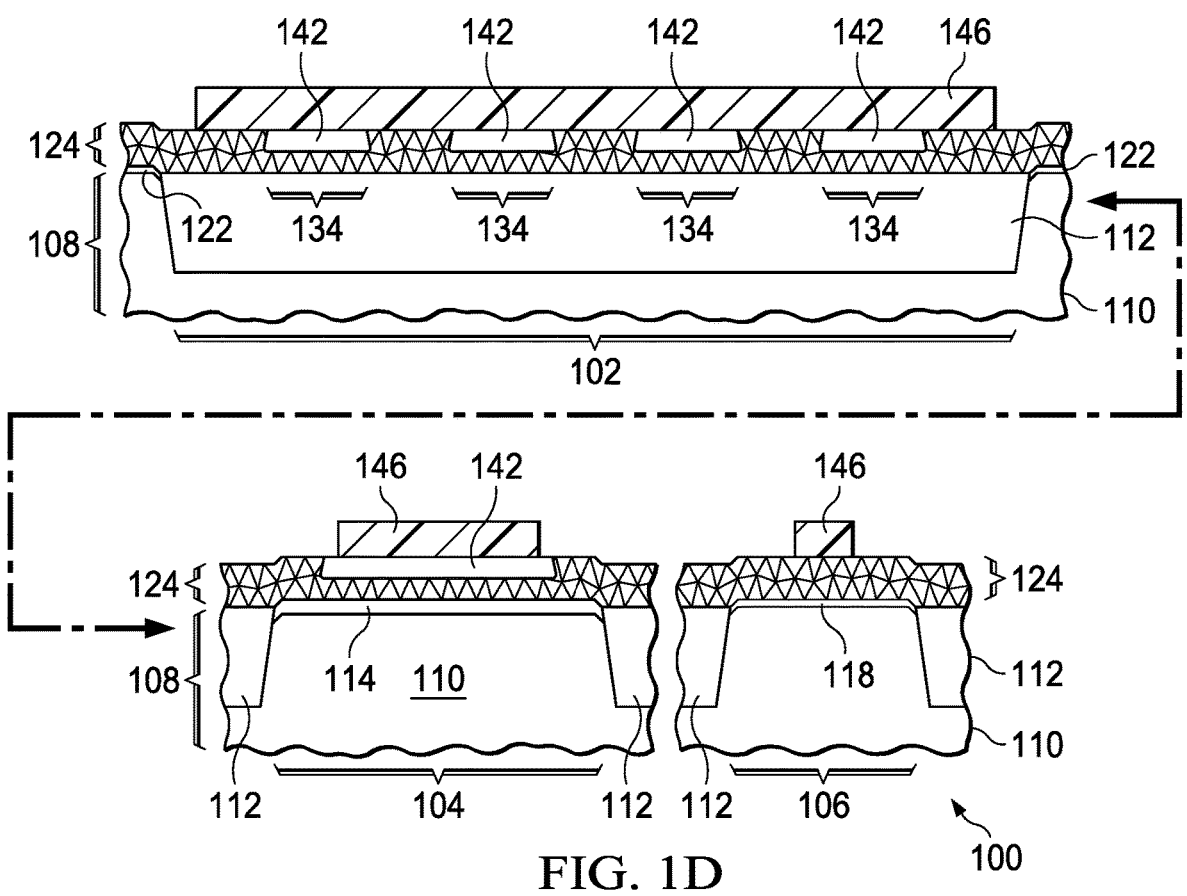
Figure 1E:
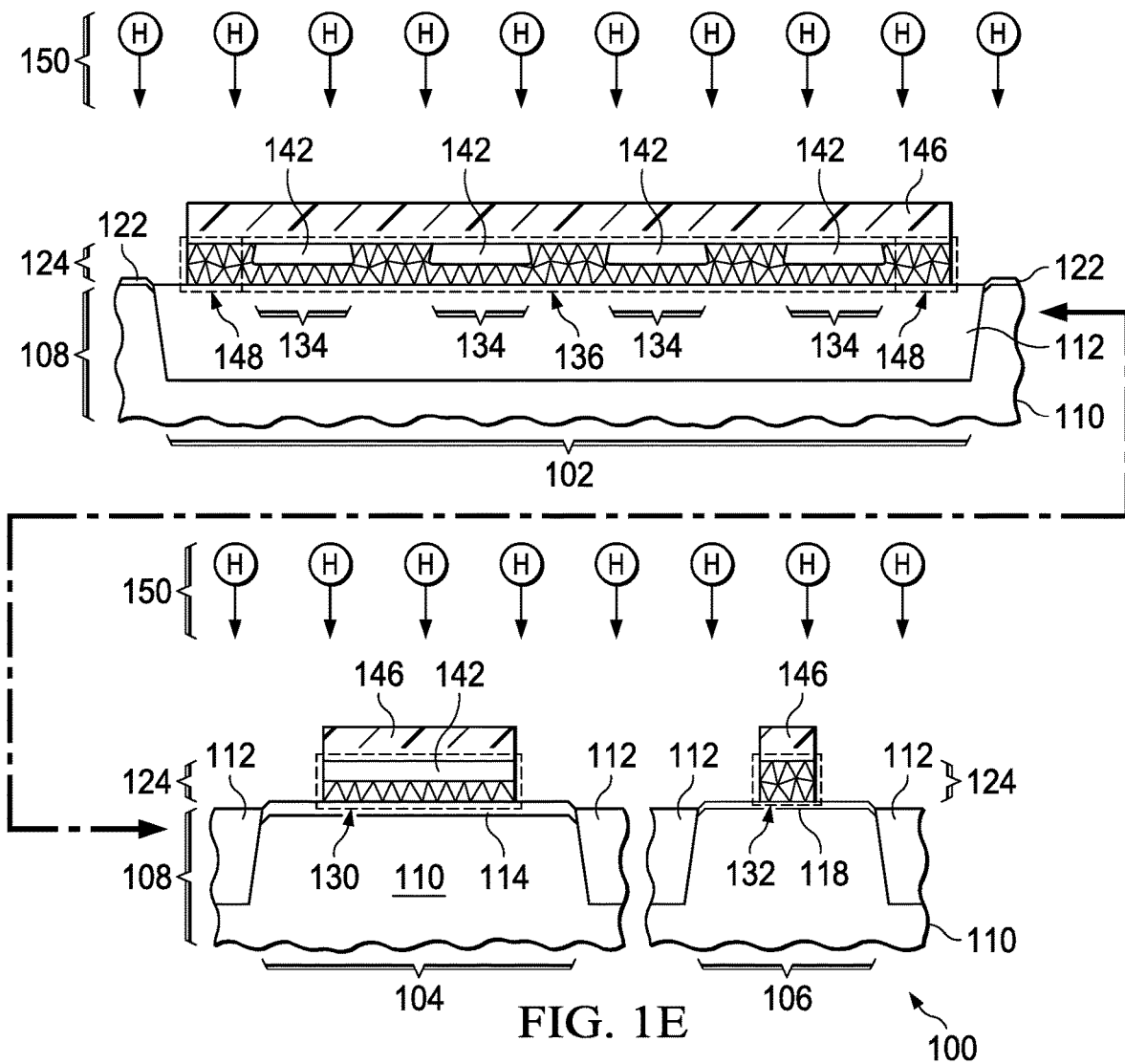

Referring to FIG. 1D, a gate etch mask 146 is formed over the gate/resistor layer 124, covering the area for the first gate 130, the area for the second gate 132, and the area for the resistor body 136. The first gate 130, the second gate 132, and the resistor body 136 are shown in FIG. 1E. The gate etch mask 146 may also cover areas for subsequently-formed resistor heads 148 of the resistor 102; the resistor heads 148 are shown in FIG. 1E.

The gate etch mask 146 may include hard mask material, such as silicon dioxide, or amorphous carbon, over the gate/resistor layer 124, and photoresist over the hard mask material. The photoresist may be patterned by a photolithographic process, and the hard mask material may be subsequently patterned by a dry etch process using the patterned photoresist as a mask. The gate etch mask 146 may also include anti-reflection material. The anti-reflection material may include an organic anti-reflection material, such as BARC, or may include an inorganic anti-reflection material, such as silicon nitride.

Referring to FIG. 1E, a gate etch process removes polysilicon from the gate/resistor layer 124 of FIG. 1D where exposed by the gate etch mask 146, leaving remaining gate/resistor layer 124 to form the resistor body 136 and the resistor heads 148 of the resistor 102, form the first gate 130 of the first MOS transistor 104, and form the second gate 132 of the second MOS transistor 106. The gate etch process may be implemented as a reactive ion etch (RIE) process using halogen radicals 150, labeled "H" in FIG. 1E. The halogen radicals 150 may include fluorine radicals, chlorine radicals, or bromine radicals. The halogen radicals may be supplied by any of various gas species, such as diatomic halogen gases ($F_2$, $Cl_2$, or $Br_2$), carbon tetrafluoride ($CF_4$), sulfur hexafluoride ($SF_6$), or boron trichloride ($BCl_3$), of hydrogen bromide (HBr). The amorphous silicon regions 142 may remain in an amorphous state during the gate etch process.

After the gate etch process is completed, the gate etch mask 146 may be removed. Photoresist organic anti-reflection material, and amorphous carbon in the gate etch mask 146 may be removed by an asher process, followed by a wet clean process. Silicon dioxide and silicon nitride in the gate etch mask 146 may be removed by a plasma etch process using fluorine radicals and carbon, with a high selectivity to the polysilicon.

Figure 1F:
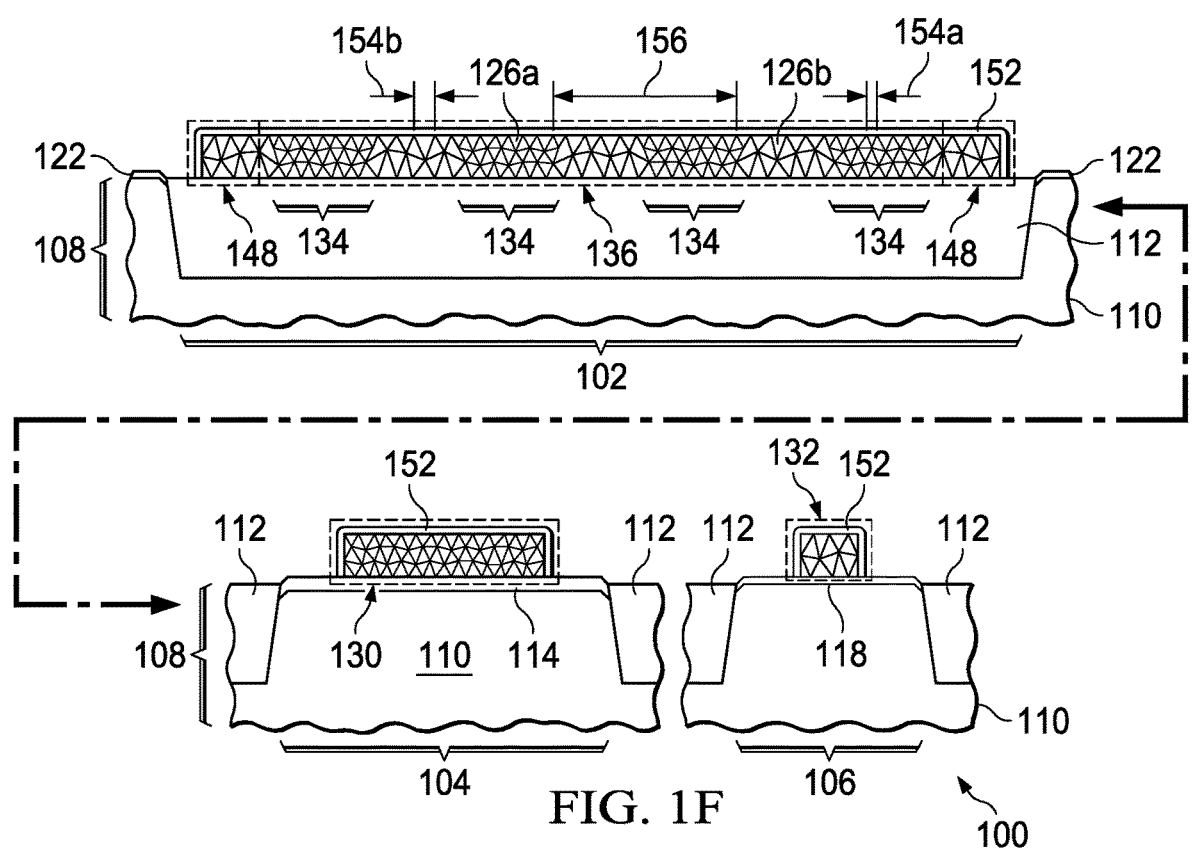

Referring to FIG. 1F, a polysilicon oxide layer 152 is formed on the resistor body 136 and the resistor heads 148, the first gate 130, and the second gate 132. The polysilicon oxide layer 152 may be formed by a thermal oxidation process, which heats the semiconductor device 100 to a temperature of at least 800° C. in an oxygen-containing ambient for 20 minutes to 100 minutes, followed by an anneal process which heats the semiconductor device 100 to a temperature of at least 800° C. in an inert ambient for 20 minutes to 50 minutes. During the thermal oxidation process, the amorphous silicon in the amorphous silicon regions 142 of FIG. 1E is recrystallized into polysilicon in the implant segments 134. The first dose of fluorine 144 of FIG. 1C in the implant segments 134 inhibits grain growth when the amorphous silicon is recrystallized, so that the grains 126a of crystalline silicon in the implant segments 134 have a first average size 154a that is smaller than a second average size 154b of the grains 126b between the implant segments 134. Thus, the resistor body 136 has a laterally alternating distribution of the silicon grain sizes 154a and 154b. The alternating distribution of silicon grain sizes has a lateral pitch 156 that is defined by the fluorine implant mask 128 of FIG. 1C. The lateral pitch 156 may be less than 2 microns, to provide a more uniform distribution of the first dose of the fluorine 144 in the resistor body 136, compared to forming the resistor body 136 with a larger lateral pitch.

In an alternate version of this example, the polysilicon oxide layer 152 may be formed by a plasma enhanced chemical vapor deposition (PECVD) process at a temperature sufficiently low that the amorphous silicon in the amorphous silicon regions 142 does not recrystallize. In this alternate version, recrystallization of the amorphous silicon occurs later in the fabrication sequence for forming the semiconductor device 100.

Figure 1G:
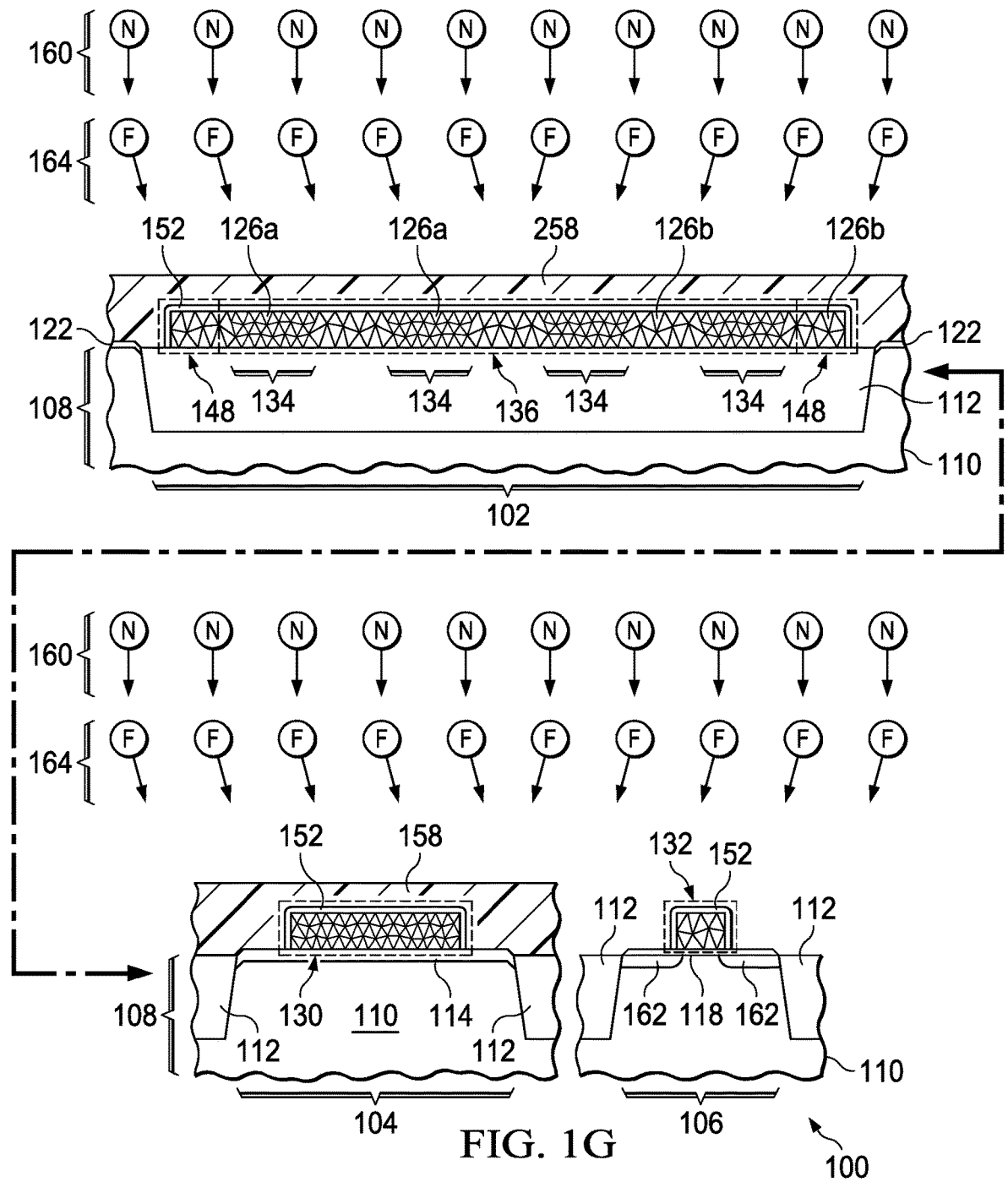

Referring to FIG. 1G, a lightly doped drain (LDD) mask 158 is formed over the semiconductor device 100, exposing the second MOS transistor 106, and covering the resistor 102 and the first MOS transistor 104. The LDD mask 158 may include photoresist that is patterned by a photolithographic process.

LDD dopants 160 are implanted into the semiconductor material 110 where exposed by the LDD mask 158. In this example, the LDD dopants 160, labeled "N" in FIG. 1G, are implemented as n-type dopants, such as primarily phosphorus and arsenic, and optionally antimony. The LDD dopants 160 may be implanted with a total dose of $1\times10^{15}$ cm$^{-2}$ to $5\times10^{15}$ cm$^{-2}$, by way of example. The LDD dopants 160 form LDD implanted regions 162 in the semiconductor material 110 adjacent to the second gate 132. The LDD dopants 160 are blocked from the resistor 102 and the first MOS transistor 104 by the LDD mask 158.

A second dose of fluorine 164 may optionally be implanted into the semiconductor material 110 where exposed by the LDD mask 158. The second dose of fluorine 164 may be implanted at a total dose of 100 percent to 200 percent of the dose for the LDD dopants 160, for example. The second dose of fluorine 164 may provide a diffusion suppressant function for the LDD dopants 160 in the LDD implanted regions 162. In one version of this example, the LDD dopants 160 may be implanted at a tilt angle of 0 degrees to 3 degrees, to limit a lateral extent of the LDD implanted regions 162 under the second gate 132, and the second dose of fluorine 164 may be implanted separately at a tilt angle of 15 degrees to 30 degrees to place the second dose of fluorine 164 further under the second gate 132 than the LDD dopants 160.

Halo dopants, not shown, may be implanted into the semiconductor material 110 where exposed by the LDD mask 158. The halo dopants have a conductivity type that is opposite from the LDD dopants 160; in this example, in which the LDD dopants 160 are n-type dopants, the halo dopants are implemented as p-type dopants, such as boron. The halo dopants are implanted at a tilt angle of 20 degrees to 40 degrees, to place the halo dopants further under the second gate 132 than the LDD dopants 160.

The LDD mask 158 is subsequently removed. The LDD mask 158 may be removed as disclosed in reference to removal of the fluorine implant mask 128 of FIG. 1C.

Figure 1H:
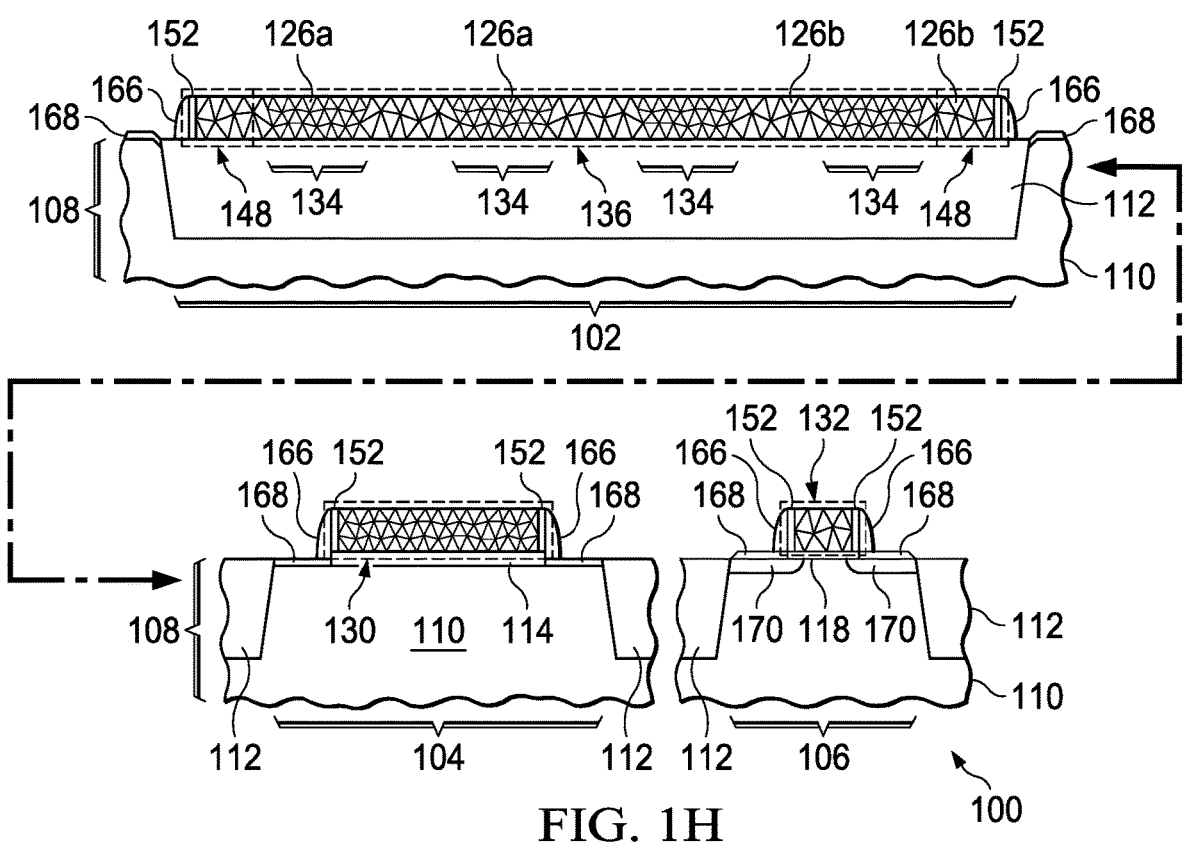

Referring to FIG. 1H, sidewall spacers 166 are formed on the polysilicon oxide layer 152 contacting lateral surfaces of the resistor 102, the first gate 130, and the second gate 132. The sidewall spacers 166 may include one or more layers of dielectric material, such as silicon nitride and silicon dioxide. The sidewall spacers 166 may be formed by forming conformal layers of the silicon nitride and silicon dioxide over the semiconductor device 100 by one or more low pressure chemical vapor deposition (LPCVD) processes or PECVD processes. The silicon dioxide may be formed using dichlorosilane and nitrous oxide, or using tetraethyl orthosilicate (TEOS), formally named tetraethoxysilane. The silicon nitride may be formed using dichlorosilane and ammonia, or using bis(tertiary-butyl-amino)silane (BTBAS). After the conformal layers are formed, the silicon nitride and silicon dioxide are removed from horizontal surfaces of the semiconductor device by an anisotropic etch process, such as an RIE process using fluorine radicals, leaving the sidewall spacers 166 in place. The sidewall spacers 166 may extend 50 nanometers to 200 nanometers laterally from the lateral surfaces of the resistor 102, the first gate 130, and the second gate 132. The polysilicon oxide layer 152 may be removed from horizontal surfaces of the resistor 102, the first gate 130, and the second gate 132 during the anisotropic etch process, as depicted in FIG. 1H. Alternatively, a portion or all of the polysilicon oxide layer 152 may remain on the horizontal surfaces of the resistor 102, the first gate 130, and the second gate 132 after the sidewall spacers 166 are formed.

A protective oxide layer 168 may be formed on exposed areas of the semiconductor material 110 adjacent to the first gate 130, and the second gate 132. A portion of the protective oxide layer 168 may be formed by the same process used to form the polysilicon oxide layer 152. A portion of the protective oxide layer 168 may be formed by a PECVD process.

The semiconductor device 100 may be heated in an LDD anneal process to repair lattice damage and activate the implanted LDD dopants 160 of FIG. 1G in the LDD implanted regions 162 of FIG. 1G, forming LDD regions 170 in the semiconductor material 110 adjacent to, and extending partway under, the second gate 132. The LDD anneal process may be implemented as a rapid thermal anneal, a spike anneal, or a flash anneal, by way of example. A rapid thermal anneal may heat the semiconductor device 100 to 1000 C to 1150° C. for 5 seconds to 60 seconds, and may be implemented in a rapid thermal processor using an incandescent lamp. A spike anneal may heat the semiconductor device 100 to 1100 C to 1250° C. for 100 milliseconds seconds to 5 seconds, and may be implemented an arc flash lamp. A flash anneal may heat an upper portion of the semiconductor device 100 containing the LDD implanted regions 162 to 1200° C. to 1350° C. for 50 microseconds to 1 millisecond, and may be implemented by a flash lamp or scanned laser.

Figure 1I:
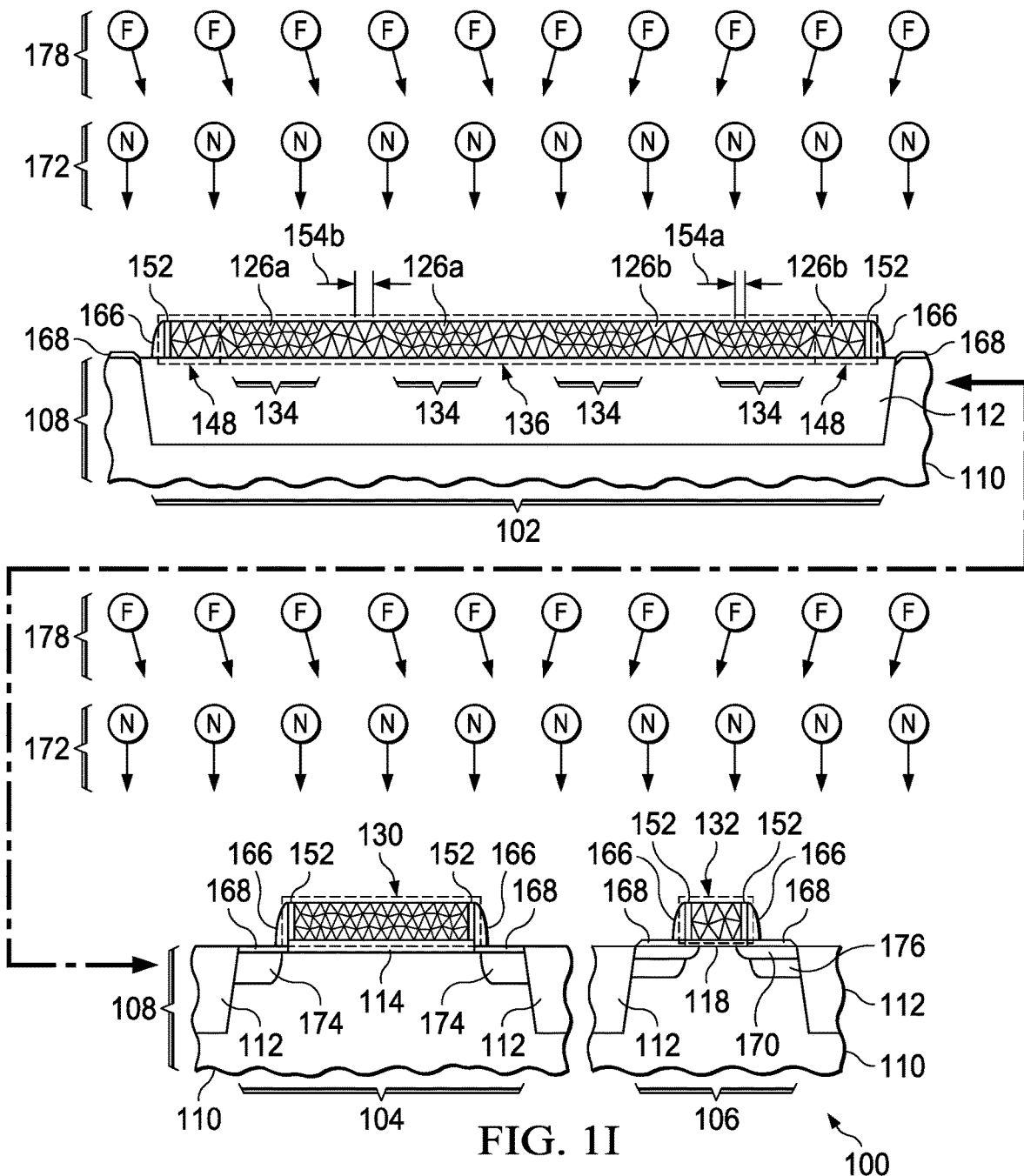

Referring to FIG. 1I, source/drain dopants 172 are implanted into the semiconductor material 110 adjacent to the sidewall spacers 166, and into the resistor 102, the first gate 130, and the second gate 132. The source/drain dopants 172 may be blocked from the substrate 108 by a source/drain implant mask, not shown, covering other areas of the semiconductor device 100, such as p-channel MOS transistors. In this example, the source/drain dopants 172, labeled "N" in FIG. 1I, are implemented as n-type dopants, such as primarily phosphorus and arsenic, and optionally antimony. The source/drain dopants 172 may be implanted with a total dose of $2\times10^{15}$ cm$^{-2}$ to $8\times10^{15}$ cm$^{-2}$, by way of example. The implanted source/drain dopants 172 increase an n-type dopant concentration in the resistor body 136 and the resistor heads 148. By way of example, for a case in which the resistor body 136 has a thickness of 100 nanometers to 150 nanometers, the source/drain dopants 172 may provide an average concentration of n-type dopants in the resistor body 136 of $2\times10^{20}$ cm$^{-3}$ to $5\times10^{20}$ cm$^{-3}$.

The implanted source/drain dopants 172 form first source/drain implanted regions 174 in the semiconductor material 110 adjacent to the sidewall spacers 166 on the first gate 130. The implanted source/drain dopants 172 also form second source/drain implanted regions 176 in the semiconductor material 110 adjacent to the sidewall spacers 166 on the second gate 132.

An optional third dose of fluorine 178 may be implanted into the semiconductor material 110 adjacent to the sidewall spacers 166, and into the resistor 102, the first gate 130, and the second gate 132. The third dose of fluorine 178 is less than the effective fluorine dose of the first dose of fluorine 144 disclosed in reference to FIG. 1C. For example, the third dose of fluorine 178 may be 10 percent to 20 percent of the first dose of fluorine 144.

In this example, the resistor body 136 may retain the laterally alternating distribution of the silicon grain sizes 154a and 154b while the source/drain dopants 172 and the third dose of fluorine 178 are implanted, as indicated in FIG.

1I, because the doses of the source/drain dopants 172 and the third dose of fluorine 178 are insufficient to amorphize the polysilicon in the resistor body 136.

Figure 1J:
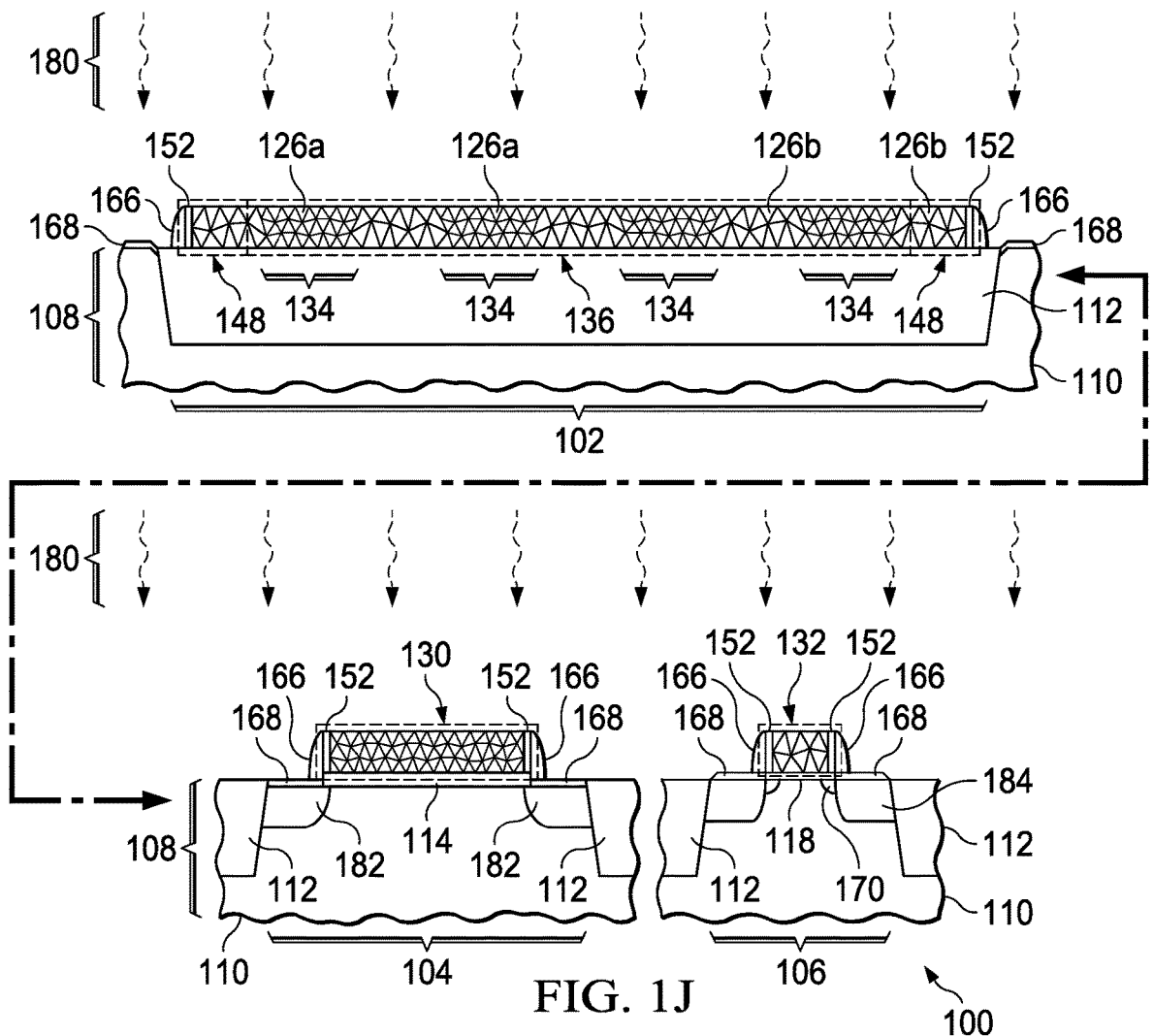

Referring to FIG. 1J, the semiconductor device 100 is heated in a source/drain anneal process 180 to repair lattice damage and activate the implanted source/drain dopants 172 in the first source/drain implanted regions 174 and the second source/drain implanted regions 176 of FIG. 1I. The source/drain anneal process 180 forms first source/drain regions 182 in the semiconductor material 110 adjacent to, and extending under, the sidewall spacers 166 on the first gate 130. The source/drain anneal process 180 forms second source/drain regions 184 in the semiconductor material 110 adjacent to, and extending partway under, the sidewall spacers 166 on the second gate 132. The second source/drain regions 184 are merged with the LDD regions 170. The source/drain anneal process 180 may be implemented as a rapid thermal anneal, a spike anneal, or a flash anneal, by way of example.

Figure 1K:
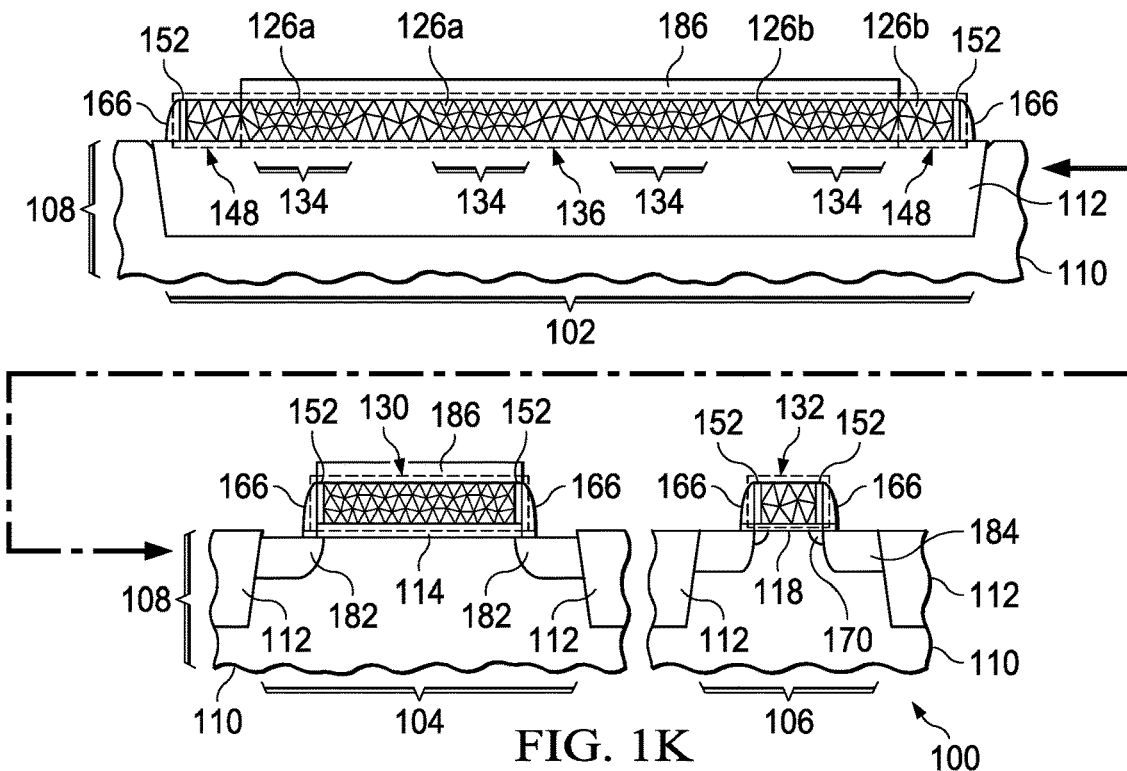

Referring to FIG. 1K, a silicide blocking layer 186 is formed on the semiconductor device 100, covering the resistor body 136 and at least a portion of the first gate 130. The silicide blocking layer 186 exposes the resistor heads 148, the first source/drain regions 182 and the second source/drain regions 184. The silicide blocking layer 186 optionally expose the second gate 132, as depicted in FIG. 1K. The silicide blocking layer 186 may include silicon dioxide or silicon nitride, for example. The silicide blocking layer 186 may be formed by forming a layer of dielectric material containing silicon dioxide or silicon nitride over the semiconductor device 100 by a PECVD process, to avoid high temperatures that would cause unwanted diffusion of dopants in the semiconductor material 110. The layer of dielectric material is patterned by forming an etch mask, not shown, over the layer of dielectric material by a photolithographic process, and removing the layer of dielectric material where exposed by the etch mask. The etch mask is subsequently removed, leaving unetched portions of the layer of dielectric material in place to provide the silicide blocking layer 186.

The protective oxide layer 168 of FIG. 1J is removed where exposed by the sidewall spacers 166, exposing the first source/drain regions 182 and the second source/drain regions 184. The protective oxide layer 168 may be removed before the silicide blocking layer 186 is formed, during formation of the silicide blocking layer 186, or after the silicide blocking layer 186 is formed.

Figure 1L:
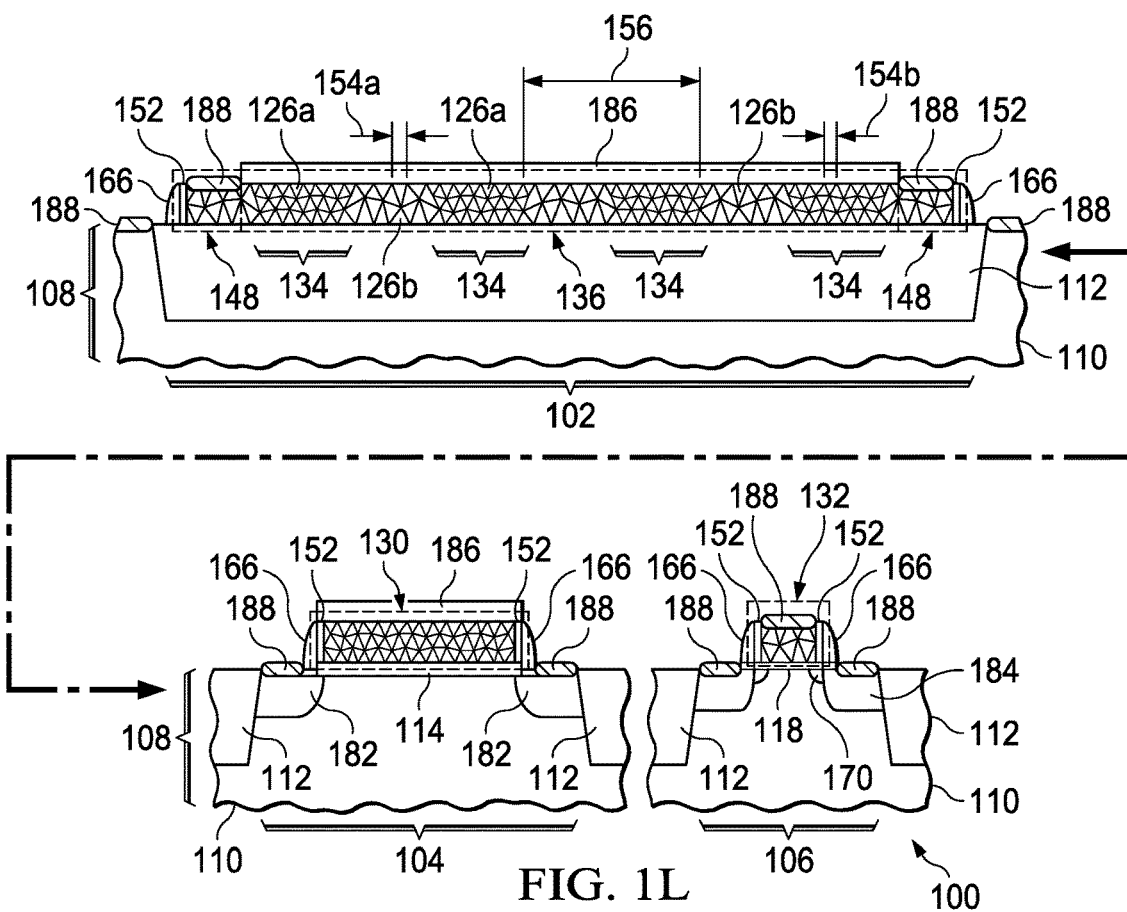

Referring to FIG. 1L, metal silicide 188 is formed on the resistor heads 148, the first source/drain regions 182 and the second source/drain regions 184, and optionally on the second gate 132. The metal silicide 188 may include titanium silicide, cobalt silicide, or nickel silicide, by way of example. The metal silicide 188 may be formed by forming a layer of metal, such as titanium, cobalt, or nickel, on the semiconductor device 100, contacting the resistor heads 148, the first source/drain regions 182, the second source/drain regions 184, and the second gate 132. Subsequently, the semiconductor material 110 and the layer of metal are heated to react the layer of metal with silicon in the resistor heads 148, the first source/drain regions 182, the second source/drain regions 184, and the second gate 132, forming the metal silicide 188. Unreacted metal is removed from the semiconductor device 100, leaving the metal silicide 188 in place. The unreacted metal may be removed by a wet etch process using an aqueous mixture of sulfuric acid and hydrogen peroxide, or an aqueous mixture of nitric acid and hydrochloric acid, by way of example.

The resistor body 136 may have an average concentration of fluorine that is 40 percent to 80 percent of an average concentration of fluorine in the first gate 130, as a result of the implant segments 134 occupying 25 percent to 75 percent of the resistor body 136, and the third dose of fluorine 178, of FIG. 1I, being 10 percent to 20 percent of the first dose of fluorine 144, of FIG. 1C. In an alternate version of this example, in which the resistor body 136 is not implanted with the third dose of fluorine 178, the resistor body 136 may have an average concentration of fluorine that is 25 percent to 75 percent of an average concentration of fluorine in the first gate 130, as a result of the implant segments 134 occupying 25 percent to 75 percent of the resistor body 136. Considering both versions, the resistor body 136 may have an average concentration of fluorine of $1 \times 10^{20}$ cm$^{-3}$ to $6.5 \times 10^{20}$ cm$^{-3}$.

The resistor body 136 may retain the laterally alternating distribution of the silicon grain sizes 154a and 154b after the metal silicide 188 is formed. Having the lateral pitch 156 of the alternating distribution at less than 2 microns may provide a uniform distribution of the fluorine in the resistor body 136, which may advantageously provide tighter control of the temperature coefficient of resistance of the resistor body 136, compared to a similar resistor body having a greater lateral pitch.

In one version of this example, the resistor body 136 may have a temperature coefficient of resistance that is substantially zero, within fabrication tolerances of polysilicon deposition processes and ion implantation processes used in forming the resistor body 136, that is, a temperature coefficient of resistance of −20 ppm/° C. to 20 ppm/° C. Having the temperature coefficient of resistance that is substantially zero may advantageously provide temperature independence for a circuit containing the resistor 102.

In another version of this example, the resistor body 136 may have a temperature coefficient of resistance in a range of a desired positive value, such as 75 ppm/° C. to 125 ppm/° C., for use in a sensor circuit.

The first MOS transistor 104 may advantageously have lower noise than a comparable MOS transistor having LDD regions and without fluorine in the gate. The first MOS transistor 104 may be used in a low noise analog circuit, such as an amplifier circuit, for example. The second MOS transistor 106 may advantageously have higher speed than a comparable MOS transistor without LDD regions. The second MOS transistor 106 may be used in a high speed, noise tolerant circuit such as a logic circuit.

Forming the first gate 130 with a higher average concentration of fluorine than the resistor body 136, and attaining a desired temperature coefficient of resistance, using a common fluorine implant and a single fluorine implant mask, as disclosed in reference to FIG. 1A through FIG. 1L, may advantageously reduce a fabrication cost and complexity of the semiconductor device 100, compared to using separate fluorine implants and two fluorine implant masks.

Figure 2A:
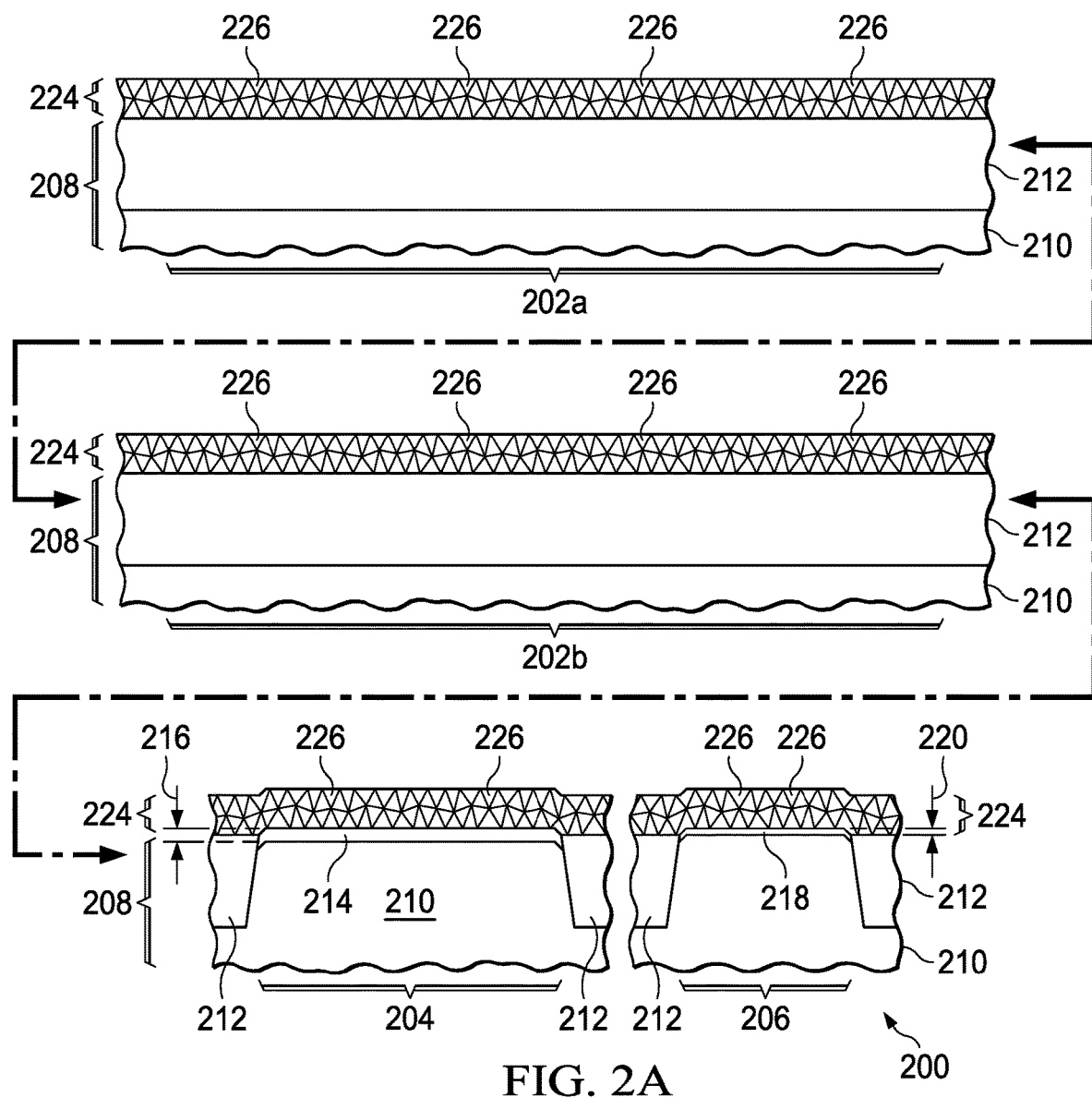
FIG. 2A through FIG. 2H are cross sections of a semiconductor device including a first resistor, a second resistor, a first MOS transistor, and a second MOS transistor, depicted in another example method of formation.

FIG. 2A through FIG. 2H are cross sections of a semiconductor device 200 including a first resistor 202a, a second resistor 202b, a first MOS transistor 204, and a second MOS transistor 206, depicted in another example method of formation. In this example, the first MOS transistor 204 is described as a p-channel first MOS transistor 204, and the second MOS transistor 206 is described as an n-channel second MOS transistor 206. In alternate versions of this example, the first MOS transistor 204 may be implemented as an n-channel first MOS transistor 204, or the second MOS transistor 206 may be implemented as a p-channel second MOS transistor 206. The semiconductor device 200 is formed on a substrate 208, as disclosed in reference to FIG. 1A. The substrate 208 includes a semiconductor material 210, which may include monocrystalline silicon, as disclosed in reference to FIG. 1A. Field oxide 212 may be formed in the substrate 208. In this example, the field oxide 212 extends under the first resistor 202a under the second resistor 202b, and laterally isolates the first MOS transistor 204 and the second MOS transistor 206. The field oxide 212 may have an STI configuration, as indicated in FIG. 2A, or may have a LOCOS configuration.

A first gate dielectric layer 214 is formed on the semiconductor material 210 in an area for the first MOS transistor 204. In this example, the first gate dielectric layer 214 may have a first thickness 216 of 2 nanometers to 10 nanometers. A second gate dielectric layer 218 is formed on the semiconductor material 210 in an area for the second MOS transistor 206. In this example, the second gate dielectric layer 218 may have a second thickness 220 of 2 nanometers to 10 nanometers. The second thickness 220 may be equal to the first thickness 216, or may be less than the first thickness 216. In one version of this example, the first MOS transistor 204 may be implemented in an analog circuit, and the second MOS transistor 206 may be implemented in a logic circuit, with the first MOS transistor 204 operating at a first drain-source potential that is higher than a second drain-source potential employed to operate the second MOS transistor 206. In another version of this example, the first MOS transistor 204 may be implemented in a low-noise analog circuit, and the second MOS transistor 206 may be implemented in a high speed analog circuit, with the first MOS transistor 204 operating at a first drain-source potential that is equal to, or higher than, a second drain-source potential employed to operate the second MOS transistor 206.

A gate/resistor layer 224 is formed on the field oxide 212, the first gate dielectric layer 214, and the second gate dielectric layer 218. The gate/resistor layer 224 includes polysilicon, and may include dopants, such as boron or phosphorus. The gate/resistor layer 224 may have a thickness of 50 nanometers to 1 micron, by way of example. The gate/resistor layer 224 may be formed as disclosed in reference to FIG. 1A. The gate/resistor layer 224 includes grains 226 of monocrystalline silicon. Adjacent grains 226 contact each other at grain boundaries, which are surfaces of the grains 226.

Figure 2B:
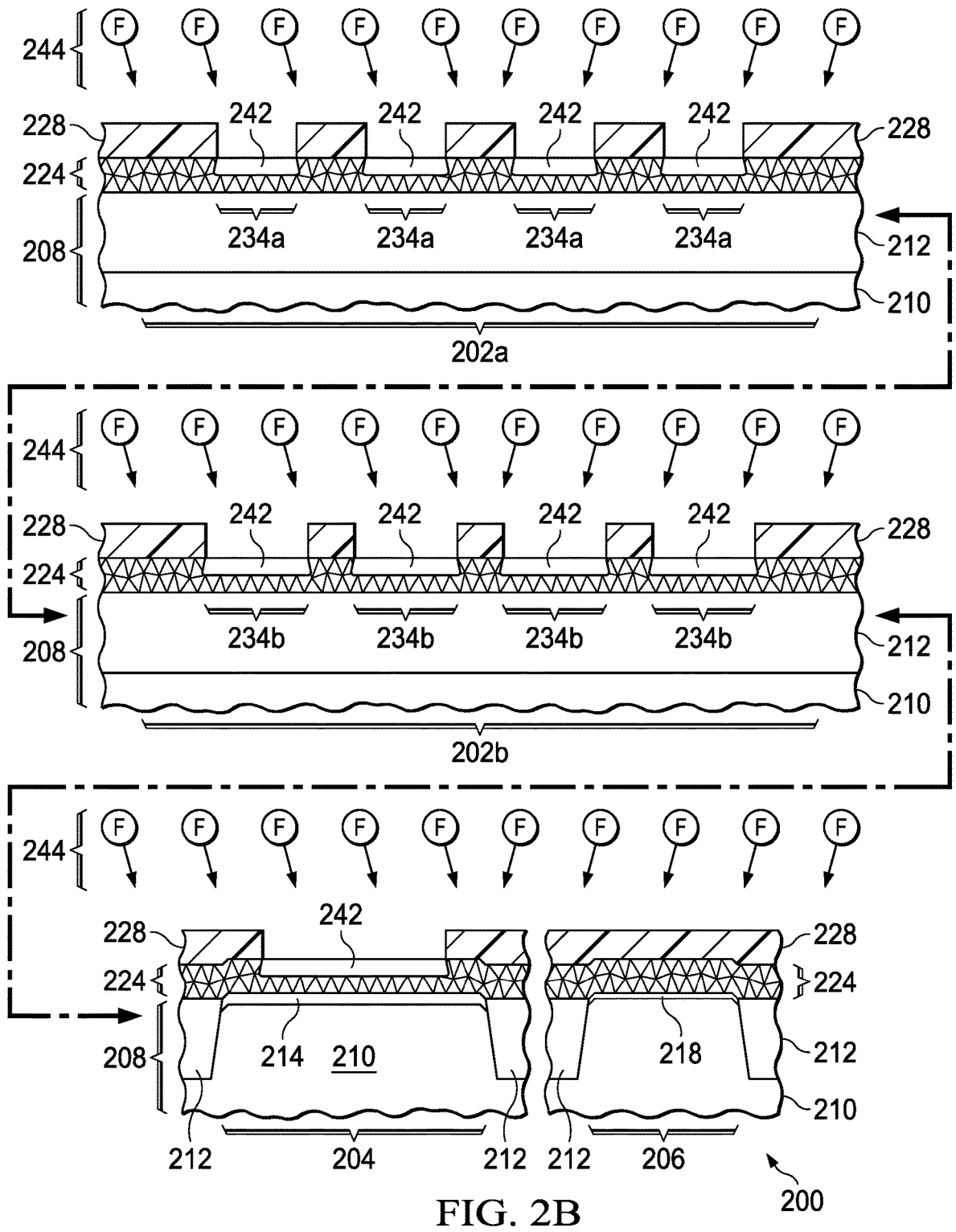

Referring to FIG. 2B, a fluorine implant mask 228 is formed over the gate/resistor layer 224. The fluorine implant mask 228 exposes the gate/resistor layer 224 in an area for a subsequently-formed first gate 230, shown in FIG. 2C, of the first MOS transistor 204. In this example, the fluorine implant mask 228 may expose all of the area for the subsequently-formed first gate 230, to maximize an amount of fluorine in the subsequently-formed first gate 230. The fluorine implant mask 228 covers the gate/resistor layer 224 in an area for a subsequently-formed second gate 232, shown in FIG. 2C, of the second MOS transistor 206. The fluorine implant mask 228 exposes the gate/resistor layer 224 over first implant segments 234a of a subsequently-formed first resistor body 236a, shown in FIG. 2C, of the first resistor 202a, and exposes the gate/resistor layer 224 over second implant segments 234b of a subsequently-formed second resistor body 236b, shown in FIG. 2C, of the second resistor 202b. The first implant segments 234a occupy a first fraction of the first resistor body 236a, and the second implant segments 234b occupy a second fraction of the second resistor body 236b. In this example, the second fraction is larger than the first fraction, that is, the first implant segments 234a occupy a smaller fraction of the first resistor body 236a, than the second implant segments 234b occupy of the second resistor body 236b. The first implant segments 234a may occupy 25 percent to 50 percent of the first resistor body 236a, and the second implant segments 234b may occupy 50 percent to 75 percent of the second resistor body 236b, for example. The first implant segments 234a are laterally separated by portions of the gate/resistor layer 224 that are covered by the fluorine implant mask 228, and similarly for the second implant segments 234b. The fluorine implant mask 228 may have a composition and structure as disclosed in reference to FIG. 1B.

Fluorine 244, labeled as "F" in FIG. 2B, is implanted into the gate/resistor layer 224 where exposed by the fluorine implant mask 228. The fluorine 244 may be implanted at a total fluorine dose to attain a desired noise level in the first MOS transistor 204. The total fluorine dose depends on the thickness of the gate/resistor layer 224, as disclosed in reference to FIG. 1C. The first resistor body 236a receives a first effective fluorine dose of the fluorine 244 that may be estimated as a product of the total fluorine dose and a ratio of a combined area of the first implant segments 234a to the area of the first resistor body 236a. Similarly, the second resistor body 236b receives a second effective fluorine dose of the fluorine 244 that may be estimated as a product of the total fluorine dose and a ratio of a combined area of the second implant segments 234b to the area of the second resistor body 236b.

In this example, the fluorine 244 may form amorphous silicon regions 242 in the gate/resistor layer 224 where exposed by the fluorine implant mask 228, in the first implant segments 234a, the second implant segments 234b, and in the area for the first gate 230. The amorphous silicon regions 242 of this example may have less than completely amorphous silicon, and so may also include small regions of crystalline silicon.

The ratio of the combined area of the first implant segments 234a to the area of the first resistor body 236a may be selected to attain a first effective fluorine dose to provide a desired first temperature coefficient of resistance in the first resistor body 236a. Similarly, the ratio of the combined area of the second implant segments 234b to the area of the second resistor body 236b may be selected to attain a second effective fluorine dose to provide a desired second temperature coefficient of resistance in the second resistor body 236b. The second temperature coefficient of resistance may be different from the first temperature coefficient of resistance.

In one version of this example, the first resistor body 236a may have the first temperature coefficient of resistance substantially zero, and the first resistor 202a may be used in a temperature-independent circuit, while the second resistor body 236b may have the second temperature coefficient of resistance greater than zero, and the second resistor 202b may be used in a temperature sensor circuit. In another version of this example, the first resistor body 236a may have the first temperature coefficient of resistance less than zero, and the first resistor 202a may be used in a sensor compensating circuit, while the second resistor body 236b may have the second temperature coefficient of resistance substantially zero, and the second resistor 202b may be used in a temperature-independent circuit. In a further version of this example, the first resistor body 236a may have the first temperature coefficient of resistance less than zero, while the second resistor body 236b may have the second temperature coefficient of resistance greater than zero, and the first resistor 202a and the second resistor 202b may be used together in a temperature-compensating circuit. Other combinations of temperature coefficients of resistance for the resistor bodies 236a and 236b, and other applications for the resistors 202a and 202b, are within the scope of this example.

The fluorine 244 may be implanted at a tilt angle of 20 degrees to 40 degrees, to extend the implanted fluorine 244 under the fluorine implant mask 228 and thereby increase diffusion of subsequently-implanted fluorine in the first resistor body 236a between the first implant segments 234a and in the second resistor body 236b between the second implant segments 234b.

After the fluorine 244 is implanted into the gate/resistor layer 224, the fluorine implant mask 228 may be removed. The fluorine implant mask 228 may be removed as disclosed in reference to FIG. 1C.

Figure 2C:
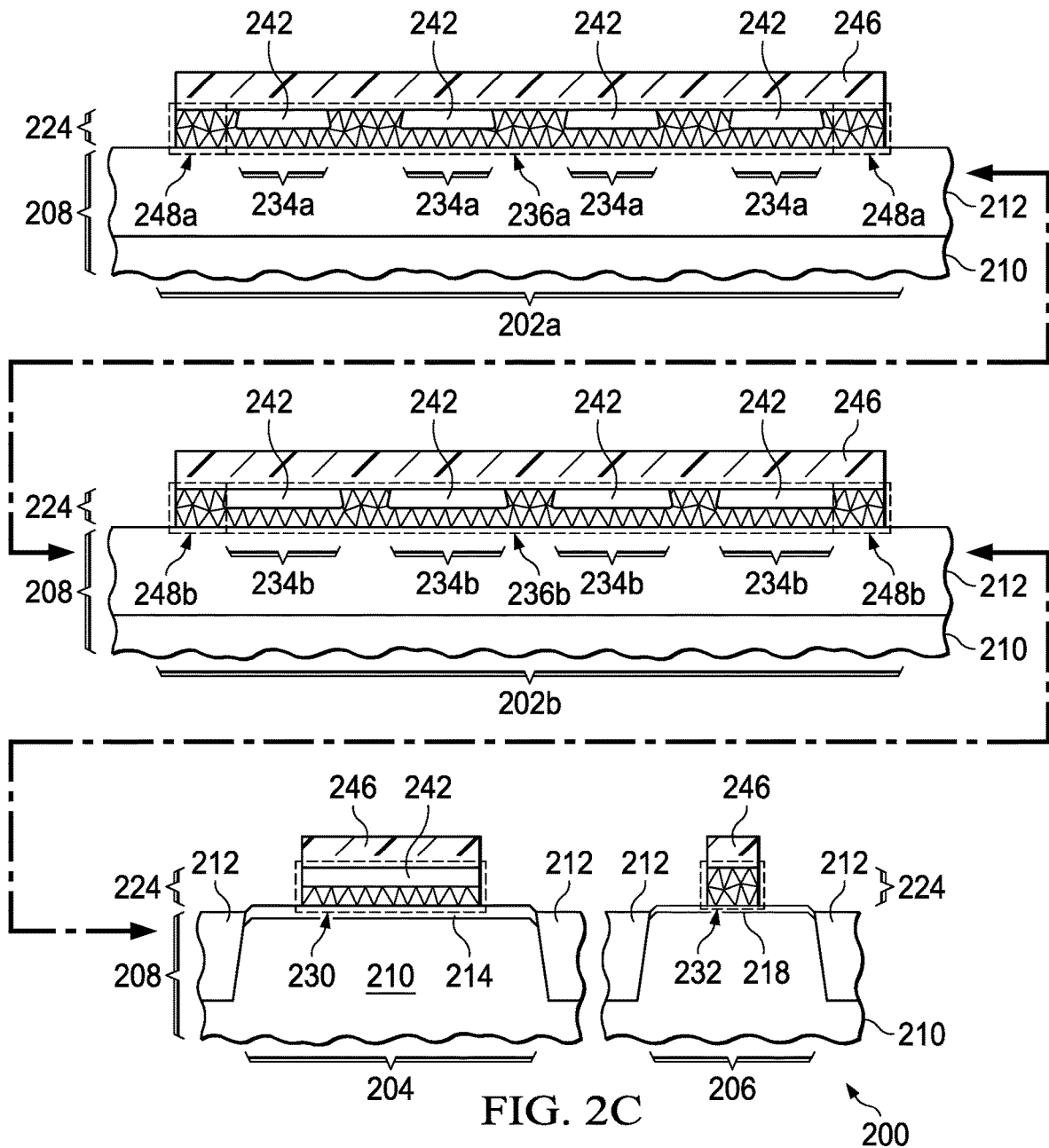

Referring to FIG. 2C, a gate etch mask 246 is formed over the gate/resistor layer 224, covering the area for the first gate 230, the area for the second gate 232, the area for the first resistor body 236a, and the area for the second resistor body 236b. The gate etch mask 246 may also cover areas for first resistor heads 248a of the first resistor 202a and areas for second resistor heads 248b of the second resistor 202b. The gate etch mask 246 may have a composition and structure as disclosed in reference to FIG. 1D.

A gate etch process removes polysilicon from the gate/resistor layer 224 of FIG. 1D where exposed by the gate etch mask 246, leaving remaining gate/resistor layer 224 to form the first resistor body 236a and the first resistor heads 248a of the first resistor 202a, form the second resistor body 236b and the second resistor heads 248b of the second resistor 202b, form the first gate 230 of the first MOS transistor 204, and form the second gate 232 of the second MOS transistor 206. The gate etch process may be implemented as disclosed in reference to FIG. 1E the amorphous silicon regions 242 may remain in an amorphous state during the gate etch process.

After the gate etch process is completed, the gate etch mask 246 may be removed, for example as disclosed in reference to FIG. 1E, leaving the first resistor body 236a and the first resistor heads 248a, the second resistor body 236b and the second resistor heads 248b, the first gate 230 of the first MOS transistor 204, and the second gate 232 in place.

Figure 2D:
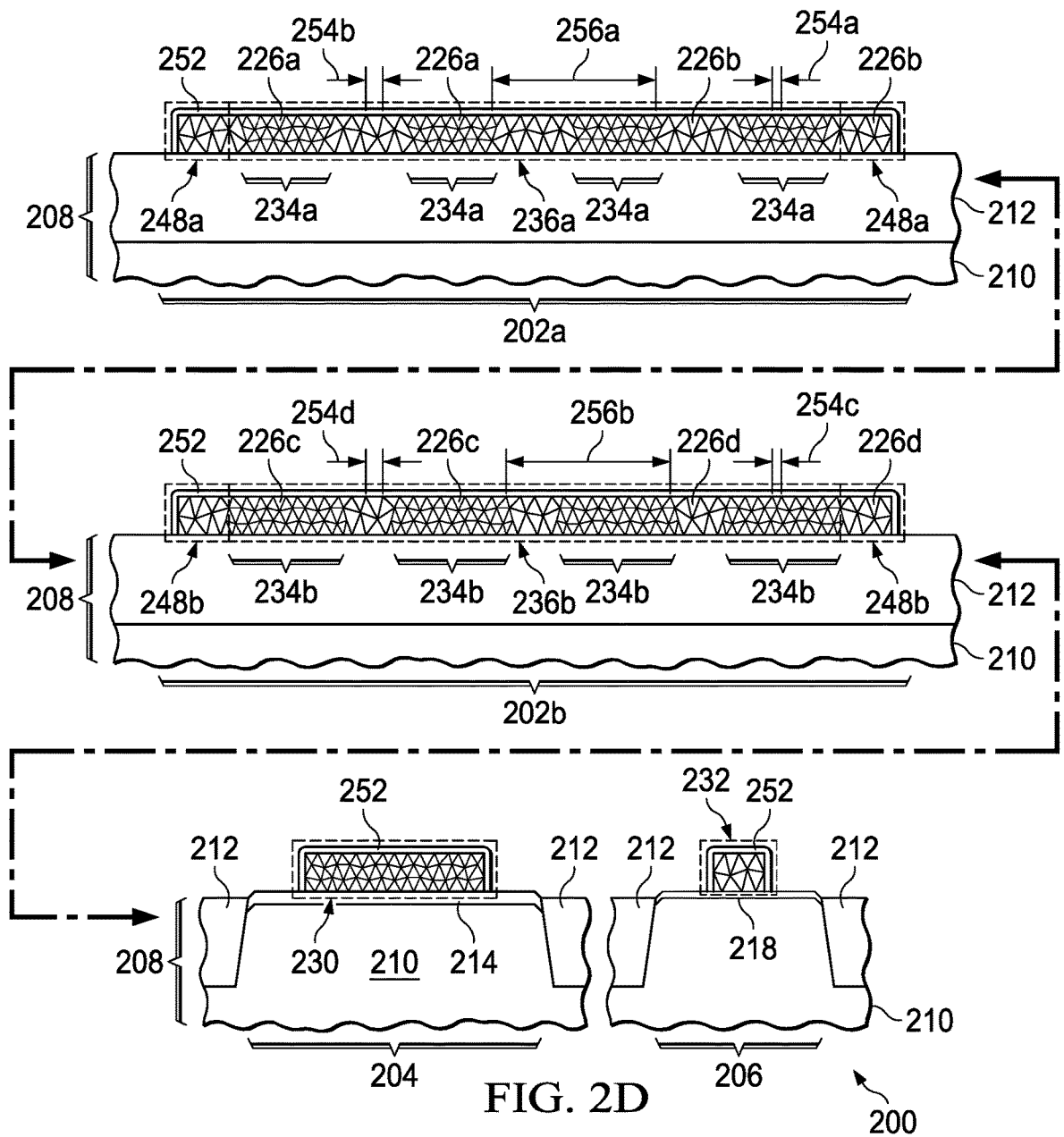

Referring to FIG. 2D, a polysilicon oxide layer 252 is formed on the first resistor body 236a and the first resistor heads 248a, on the second resistor body 236b and the second resistor heads 248b, on the first gate 230, and on the second gate 232. The polysilicon oxide layer 252 may be formed by a thermal oxidation process, or an LPCVD or PECVD process. In versions of this example in which the polysilicon oxide layer 252 is formed by the thermal oxidation process, the amorphous silicon in the amorphous silicon regions 242 of FIG. 2C is recrystallized into polysilicon in the first implant segments 234a and the second implant segments 234b. The fluorine 244 of FIG. 2B in the first implant segments 234a and the second implant segments 234b inhibits grain growth when the amorphous silicon is recrystallized. The grains 226a of crystalline silicon in the first implant segments 234a have a first average size 254a that is smaller than a second average size 254b of the grains 226b between the first implant segments 234a. Thus, the first resistor body 236a has a first laterally alternating distribution of the silicon grain sizes 254a and 254b. The first alternating distribution of silicon grain sizes has a first lateral pitch 256a that is defined by the fluorine implant mask 228 of FIG. 2B. The first lateral pitch 256a may be less than 2 microns, accruing the advantage of uniform distribution of the fluorine 244, as disclosed in reference to FIG. 1F.

Similarly, the grains 226c of crystalline silicon in the second implant segments 234b have a third average size 254c that is smaller than a fourth average size 254d of the grains 226d between the second implant segments 234b. Thus, the second resistor body 236b has a second laterally alternating distribution of the silicon grain sizes 254c and 254d. The second alternating distribution of silicon grain sizes has a second lateral pitch 256b that is defined by the fluorine implant mask 228. The second lateral pitch 256b may be less than 2 microns, to provide a more uniform distribution of the fluorine 244 in the second resistor body 236b.

In versions of this example in which the polysilicon oxide layer 252 is formed by a low temperature process, recrystallization of the amorphous silicon occurs later in the fabrication sequence for forming the semiconductor device 200. Recrystallization of the amorphous silicon may occur at an LDD anneal, for example.

Figure 2E:
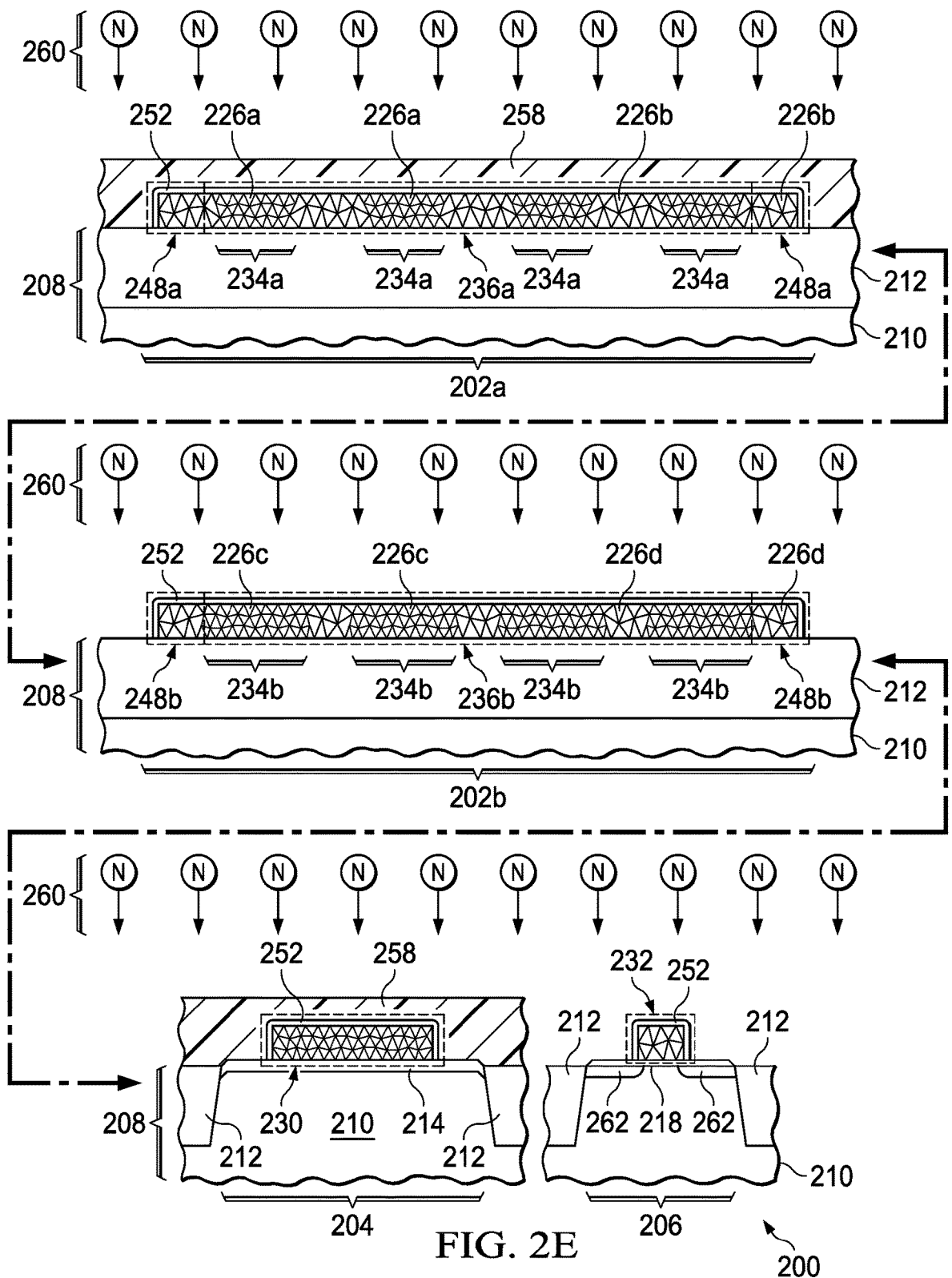

Referring to FIG. 2E, an LDD mask 258 is formed over the semiconductor device 200, exposing the second resistor 202b and the second MOS transistor 206, and covering the first resistor 202a and the first MOS transistor 204. The LDD mask 258 may include photoresist that is patterned by a photolithographic process.

LDD dopants 260 are implanted into the semiconductor material 210 and the polysilicon of the second resistor 202b, where exposed by the LDD mask 258. In this example, the LDD dopants 260, labeled "N" in FIG. 2E, are implemented as n-type dopants, such as primarily phosphorus, arsenic, and antimony. The LDD dopants 260 may be implanted with a total dose of $1\times10^{15}$ cm$^{-2}$ to $5\times10^{15}$ cm$^{-2}$, by way of example. The LDD dopants 260 form LDD implanted regions 262 in the semiconductor material 210 adjacent to the second gate 232. The LDD dopants 260 are blocked from the first resistor 202a and the first MOS transistor 204 by the LDD mask 258. In a version of the example in which the second resistor body 236b has a thickness of 100 nanometers to 150 nanometers, the LDD dopants 260 may provide an average concentration of n-type dopants in the second resistor body 236b of $1\times10^{20}$ cm$^{-3}$ to $3\times10^{20}$ cm$^{-3}$.

Halo dopants, not shown, may be implanted into the semiconductor material 210 at a tilt angle of 20 degrees to 40 degrees, where exposed by the LDD mask 258. The halo dopants have a conductivity type that is opposite from the LDD dopants 260; in this example, in which the LDD dopants 260 are n-type dopants, the halo dopants are implemented as p-type dopants, such as boron.

The LDD mask 258 is subsequently removed. The LDD mask 258 may be removed as disclosed in reference to removal of the fluorine implant mask 228 of FIG. 2B.

Figure 2F:
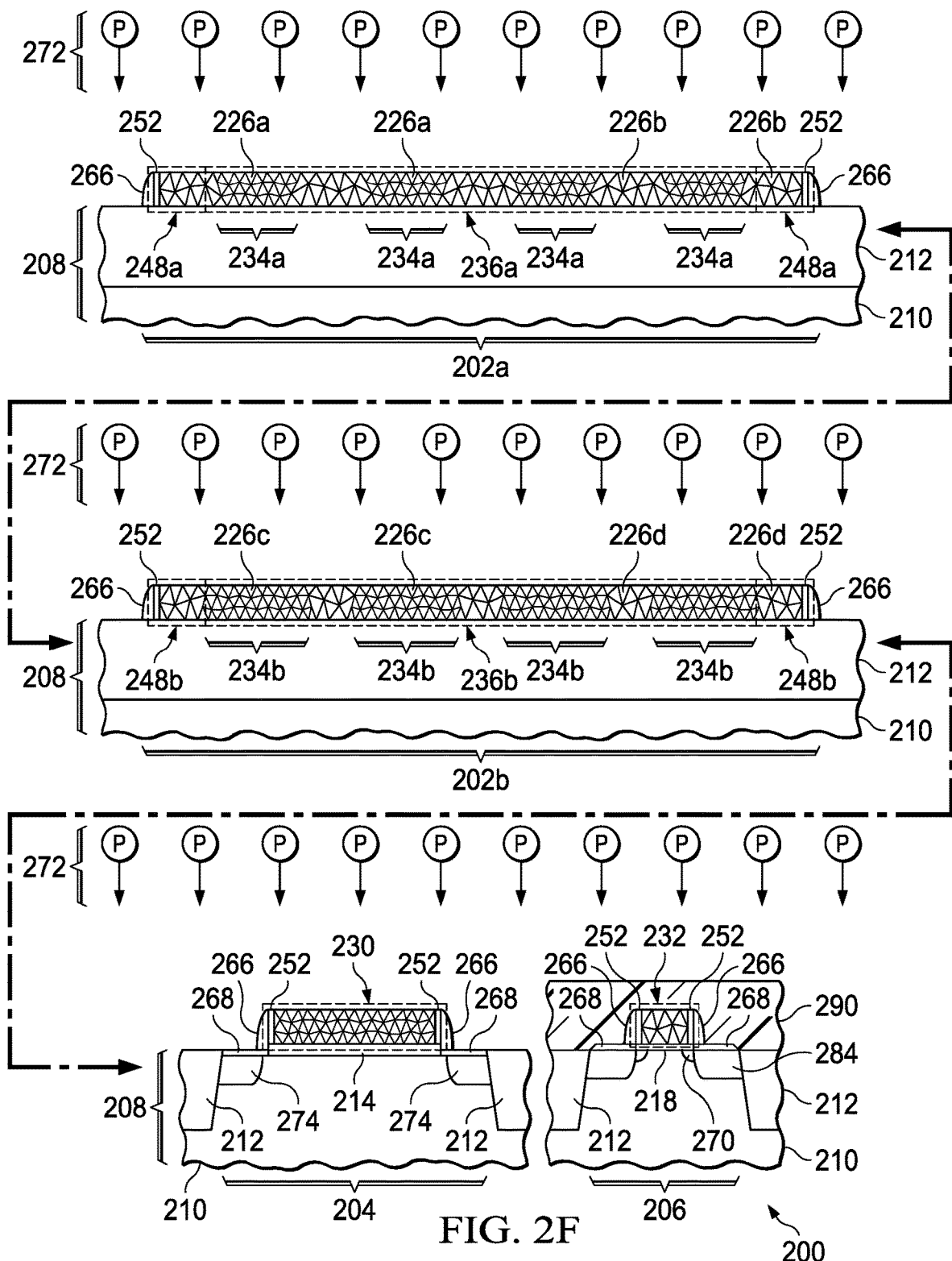

Referring to FIG. 2F, the semiconductor device 200 may be heated in an LDD anneal process to repair lattice damage and activate the implanted LDD dopants 260 of FIG. 2E in the LDD implanted regions 262 of FIG. 2E, forming LDD regions 270 in the semiconductor material 210 adjacent to, and extending partway under, the second gate 232. The LDD anneal process may be implemented as a rapid thermal anneal, a spike anneal, or a flash anneal, by way of example. The LDD regions 270 of this example are n-type.

Second source/drain regions 284 are formed in the semiconductor material 210 adjacent to, and extending partway under, the sidewall spacers 266 on the second gate 232. The second source/drain regions 284 of this example are n-type. The second source/drain regions 284 may be formed by implanting n-type dopants, such as phosphorus, arsenic, and antimony, into the semiconductor material 210 adjacent to the sidewall spacers 266 on the second gate 232, and annealing the semiconductor material 210 to activate the implanted n-type dopants. The second source/drain regions 284 are merged with the LDD regions 270.

Sidewall spacers 266 are formed on the polysilicon oxide layer 252 contacting lateral surfaces of the first resistor 202a, the second resistor 202b, the first gate 230, and the second gate 232. The sidewall spacers 266 may have a structure and composition, and may be formed, as disclosed in reference to FIG. 1H. A protective oxide layer 268 may be formed on exposed areas of the semiconductor material 210 adjacent to the first gate 230, and the second gate 232.

A source/drain mask 290 is formed over the semiconductor device 200, exposing the first resistor 202a, the second resistor 202b, and the first MOS transistor 204, and covering the second MOS transistor 206. The source/drain mask 290 may include photoresist that is patterned by a photolithographic process.

Source/drain dopants 272 are implanted into the first gate 230, into the semiconductor material 210 adjacent to the sidewall spacers 266 on the first gate 230, into the first resistor 202a, and into the second resistor 202b. The source/drain dopants 272 are blocked from the second MOS transistor 206 by the source/drain mask 290. In this example, the source/drain dopants 272, labeled "P" in FIG. 2F, are implemented as p-type dopants, such as primarily boron, and optionally indium or gallium. The source/drain dopants 272 may be implanted with a total dose of $2\times10^{15}$ cm$^{-2}$ to $8\times10^{15}$ cm$^{-2}$, by way of example. The implanted source/drain dopants 272 provide p-type conductivity in the first resistor body 236a and the first resistor heads 248a. The implanted source/drain dopants 272 counterdope the implanted LDD dopants 260 of FIG. 2E in the second resistor body 236b and the second resistor heads 248b, and so provide p-type conductivity in the second resistor body 236b and the second resistor heads 248b. The implanted source/drain dopants 272 form first source/drain implanted regions 274 in the semiconductor material 210 adjacent to the sidewall spacers 266 on the first gate 230.

In this example, the first resistor body 236a may retain the laterally alternating distribution of the silicon grain sizes 254a and 254b, and the second resistor body 236b may retain the laterally alternating distribution of the silicon grain sizes 254c and 254d, while the source/drain dopants 272 are implanted, as indicated in FIG. 2F, because the dose of the source/drain dopants 272 is insufficient to amorphize the polysilicon in the first resistor body 236a and the second resistor body 236b.

Figure 2G:
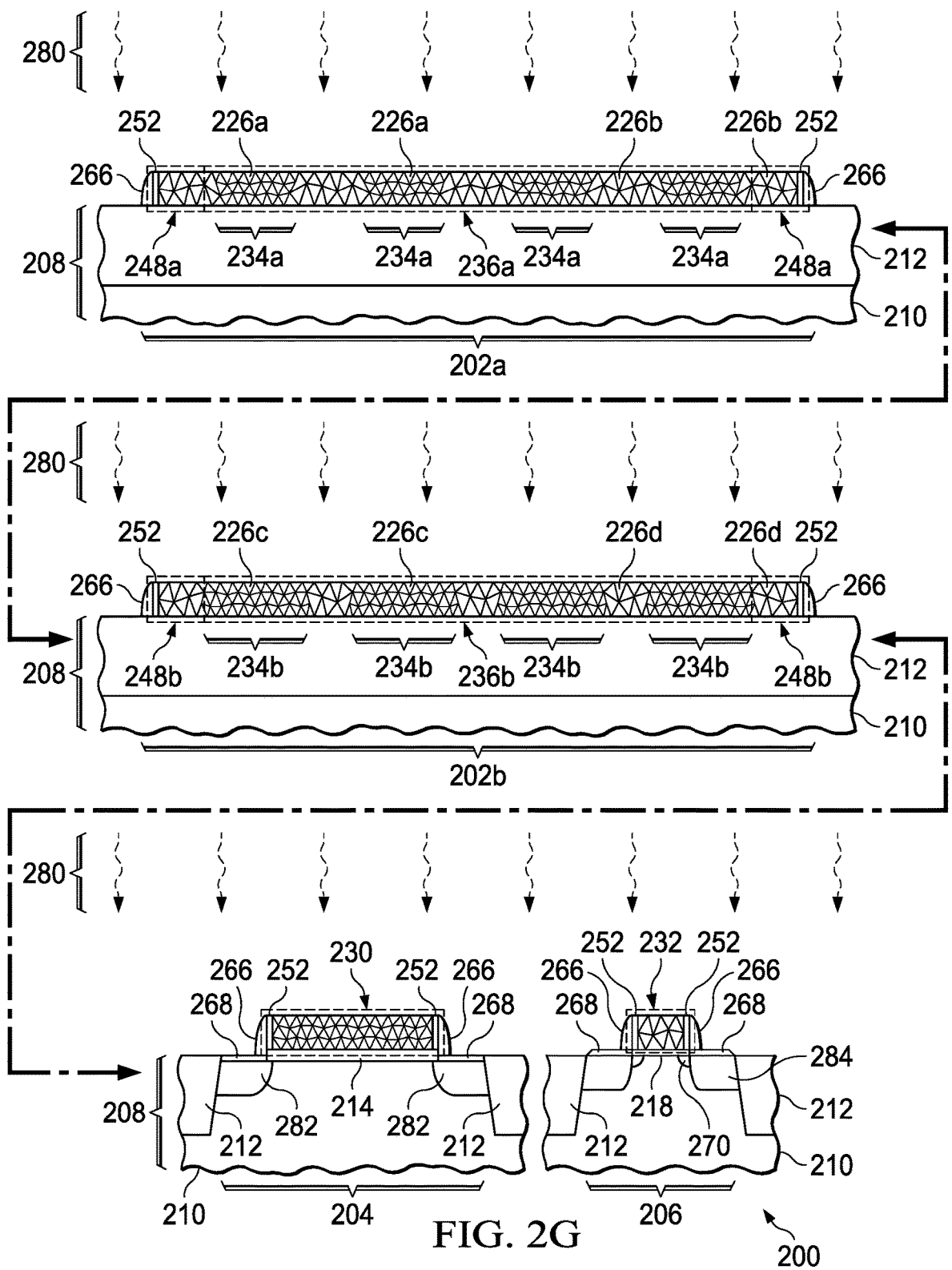

Referring to FIG. 2G, the semiconductor device 200 is heated in a source/drain anneal process 280 to repair lattice damage and activate the implanted source/drain dopants 272 in the first source/drain implanted regions 274 of FIG. 2F, forming first source/drain regions 282 in the semiconductor material 210 adjacent to, and extending under, the sidewall spacers 266 on the first gate 230. The source/drain anneal process 280 may be implemented as a rapid thermal anneal, a spike anneal, or a flash anneal, by way of example.

Figure 2H:
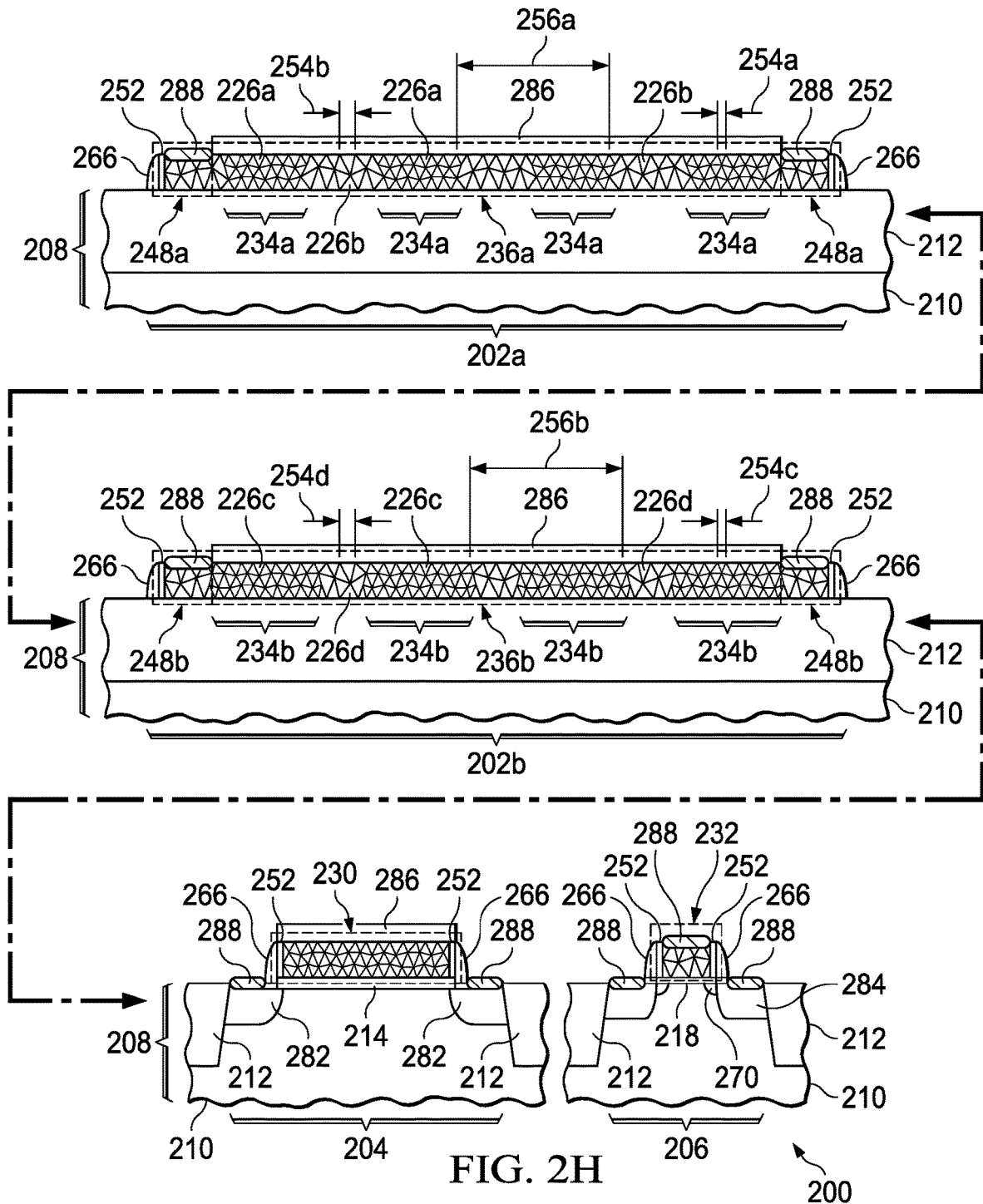

Referring to FIG. 2H, a silicide blocking layer 286 is formed on the semiconductor device 200, covering the first resistor body 236a, the second resistor body 236b, and at least a portion of the first gate 230. The silicide blocking layer 286 exposes the first resistor heads 248a, the second resistor heads 248b, the first source/drain regions 282 and the second source/drain regions 284. The silicide blocking layer 286 optionally expose the second gate 232, as depicted in FIG. 2H. The silicide blocking layer 286 may have a composition, and may be formed, as disclosed in reference to FIG. 1K. The protective oxide layer 268 of FIG. 2G is removed where exposed by the sidewall spacers 266, exposing the first source/drain regions 282 and the second source/drain regions 284.

Metal silicide 288 is formed on the first resistor heads 248a, the second resistor heads 248b, the first source/drain regions 282 and the second source/drain regions 284, and optionally on the second gate 232. The metal silicide 288 may include titanium silicide, cobalt silicide, or nickel silicide, by way of example. The metal silicide 288 may be formed as disclosed in reference to FIG. 1L.

The first resistor body 236a may retain the laterally alternating distribution of the silicon grain sizes 254a and 254b after the metal silicide 288 is formed. Similarly, the second resistor body 236b may retain the laterally alternating distribution of the silicon grain sizes 254c and 254d after the metal silicide 288 is formed. Having the lateral pitches 256a and 256b of the alternating distribution at less than 2 microns may provide a uniform distribution of the fluorine in the resistor bodies 236a and 236b, which may accrue the advantage disclosed in reference to FIG. 1L.

Forming the first gate 230 with a higher average concentration of fluorine than the first resistor body 236a and with a higher average concentration of fluorine than the second resistor body 236b, and attaining temperature coefficients of resistance in the first resistor body 236a and the second resistor body 236b, using a common fluorine implant and a single fluorine implant mask, as disclosed in reference to FIG. 2A through FIG. 2H, may advantageously reduce a fabrication cost and complexity of the semiconductor device 200, compared to using separate fluorine implants and three fluorine implant masks.

Figure 3:
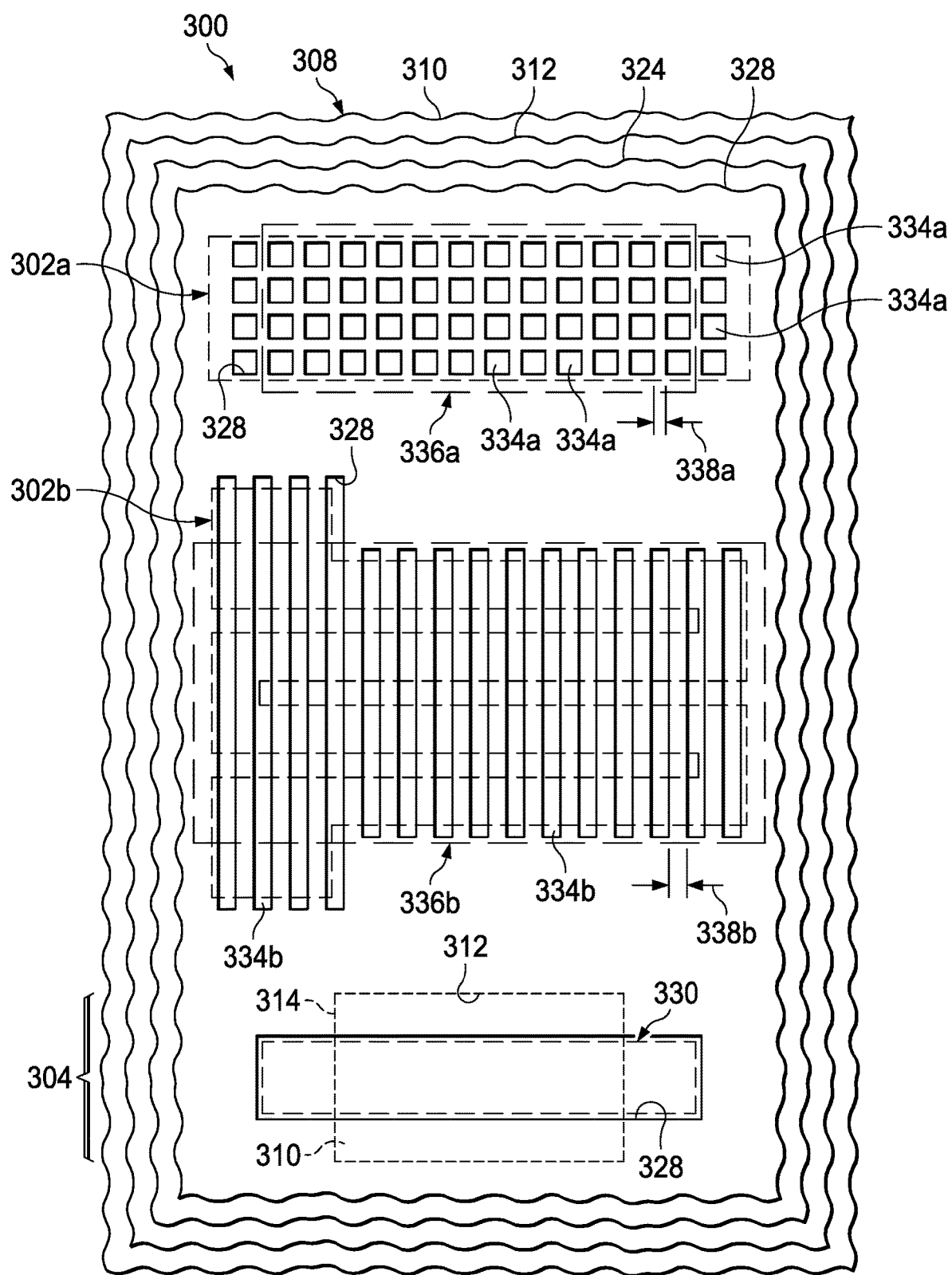
FIG. 3 is a top view of a semiconductor device including a first resistor, a second resistor, and an MOS transistor.

FIG. 3 is a top view of a semiconductor device 300 including a first resistor 302a, a second resistor 302b, and an MOS transistor 304. The semiconductor device 300 is formed on a substrate 308, as disclosed in reference to FIG. 1A. The substrate 308 includes a semiconductor material 310, which may include monocrystalline silicon, as disclosed in reference to FIG. 1A. Field oxide 312 may be formed in the substrate 308. In this example, the field oxide 312 extends under the first resistor 302a and under the second resistor 302b. The field oxide 312 laterally surrounds a portion of the semiconductor material 310 in an area for the MOS transistor 304. A first gate dielectric layer 314 is formed on the semiconductor material 310 where exposed by the field oxide 312 in the area for the MOS transistor 304. A gate/resistor layer 324 is formed on the field oxide 312 and the first gate dielectric layer 314. The gate/resistor layer 324 includes polysilicon, and may include dopants.

A fluorine implant mask 328 is formed over the gate/resistor layer 324. The fluorine implant mask 328 exposes the gate/resistor layer 324 in an area for a subsequently-formed gate 330 of the MOS transistor 304. In this example, the fluorine implant mask 328 may expose all of the area for the subsequently-formed gate 330, as depicted in FIG. 3.

The fluorine implant mask 328 exposes the gate/resistor layer 324 over first implant segments 334a of a subsequently-formed first resistor body 336a of the first resistor 302a. The first implant segments 334a may be arranged in a two dimensional array of rectangles or squares, as depicted in FIG. 3. The first implant segments 334a occupy a first fraction of the first resistor body 336a. The fluorine implant mask 328 has first separation widths 338a between adjacent instances of the first implant segments 334a; the first separation widths 338a may be less than 1 micron.

The fluorine implant mask 328 exposes the gate/resistor layer 324 over second implant segments 334b of a subsequently-formed second resistor body 336b of the second resistor 302b. The second implant segments 334b may be arranged in a linear array of strips, as depicted in FIG. 3. The second implant segments 334b occupy a second fraction of the second resistor body 336b. The fluorine implant mask 328 has second separation widths 338b between adjacent instances of the second implant segments 334b; the second separation widths 338b may be less than 1 micron.

Formation of the semiconductor device 300 may be continued as disclosed in reference to FIG. 1B through FIG. 1L, or FIG. 2B through FIG. 2H. Formation of the semiconductor device 300 may be continued using a combination of steps as disclosed in reference to both FIG. 1B through FIG. 1L, and FIG. 2B through FIG. 2H.

Various features of the examples disclosed herein may be combined in other manifestations of example semiconductor devices. For example, the resistor 102 may be formed without the PAI 140. In another example, the resistor 102 may be formed by implanting the resistor body 136 with the LDD dopants 160 and the second dose of fluorine 164, in addition to the source/drain dopants 172. In a further example, the semiconductor device 100 may further include a p-channel MOS transistor formed with p-type LDD dopants, and the resistor 102 may be formed by implanting the resistor body 136 with the p-type LDD dopants, similar to the method disclosed in reference to FIG. 2E.

In another example, the first resistor 202a and the second resistor 202b may be formed using a PAI, similar to the PAI 140 disclosed in reference to FIG. 1B. In a further example, the semiconductor device 200 may further include a p-channel MOS transistor formed with p-type LDD dopants, and either the first resistor 202a or the second resistor 202b, or both, may be formed by implanting the first resistor body 236a or the second resistor body 236b, respectively, with the p-type LDD dopants, similar to the method disclosed in reference to FIG. 1I.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A semiconductor device, comprising:
   a metal oxide semiconductor (MOS) transistor including:
   a gate dielectric layer on a semiconductor substrate; and
   a gate on the gate dielectric layer, the gate including polysilicon with a first average concentration of fluorine; and
   a resistor over the semiconductor substrate, the resistor including a resistor body having polysilicon with a second average concentration of fluorine that is less than the first average concentration.

2. The semiconductor device of claim 1, wherein the resistor body includes a laterally alternating distribution of silicon grain sizes.

3. The semiconductor device of claim 1, wherein:
   the resistor body includes a first silicon grain size and a second silicon grain size greater than the first silicon grain size; and
   the gate includes the first silicon grain size.

4. The semiconductor device of claim 1, wherein the resistor body includes germanium, indium, antimony, or a combination thereof.

5. The semiconductor device of claim 1, wherein the resistor body includes n-type dopants, such as phosphorus, arsenic, antimony, or a combination thereof.

6. The semiconductor device of claim 1, wherein the resistor body includes p-type dopants, such as boron, indium, gallium, or a combination thereof.

7. The semiconductor device of claim 1, wherein the resistor body includes n-type dopants with a third average concentration and p-type dopants with a fourth average concentration greater than the third average concentration.

8. The semiconductor device of claim 1, wherein the resistor is a first resistor having a first temperature coefficients of resistance, and the semiconductor device further comprises:
   a second resistor having a second temperature coefficients of resistance different than the first temperature coefficients of resistance.

9. The semiconductor device of claim 1, wherein the resistor is a first resistor, and the semiconductor device further comprises:
   a second resistor having polysilicon with a third average concentration of fluorine that is different than the first average concentration.

10. The semiconductor device of claim 9, wherein the first average concentration of fluorine is greater than the third average concentration of fluorine.

11. The semiconductor device of claim 1, wherein the MOS transistor is a first MOS transistor, and the semiconductor device, further comprising:
    a second MOS transistor including a second gate having polysilicon exclusive of fluorine.

12. The semiconductor device of claim 1, wherein the resistor has a temperature coefficient of resistance of −20 ppm/° C. to +20 ppm/° C.

13. The semiconductor device of claim 1, wherein the gate of the MOS transistor includes germanium, indium, antimony, or a combination thereof.

14. A semiconductor device, comprising:
    a metal oxide semiconductor (MOS) transistor including:
    a gate dielectric layer on a semiconductor substrate; and
    a gate on the gate dielectric layer, the gate having polysilicon with a first grain size; and
    a resistor over the semiconductor substrate, the resistor including a resistor body having polysilicon with the first grain size and a second grain size greater than the first grain size, wherein the first grain size and the second grain size of the resistor body laterally alternate.

15. The semiconductor device of claim 14, wherein the MOS transistor is a first MOS transistor, and the semiconductor device further comprises:
    a second MOS transistor including a second gate having polysilicon with the second grain size.

16. The semiconductor device of claim 14, wherein:
    the gate includes a first average concentration of fluorine; and
    the resistor body includes a second average concentration of fluorine less than the first average concentration of fluorine.

17. The semiconductor device of claim 16, wherein the MOS transistor is a first MOS transistor, and the semiconductor device further comprises:

a second MOS transistor including a second gate having polysilicon exclusive of fluorine.

18. The semiconductor device of claim 16, wherein the resistor is a first resistor, and the semiconductor device further comprises:
a second resistor having polysilicon with a third average concentration of fluorine that is different than the second average concentration.

19. The semiconductor device of claim 18, wherein the first average concentration of fluorine is greater than the third average concentration of fluorine.

20. The semiconductor device of claim 14, wherein the resistor body includes germanium, indium, antimony, or a combination thereof.

21. The semiconductor device of claim 14, wherein the resistor body includes n-type dopants, such as phosphorus, arsenic, antimony, or a combination thereof.

22. The semiconductor device of claim 14, wherein the resistor body includes p-type dopants, such as boron, indium, gallium, or a combination thereof.

23. The semiconductor device of claim 14, wherein the resistor body includes n-type dopants with a first average concentration and p-type dopants with a second average concentration greater than the first average concentration.

24. The semiconductor device of claim 14, wherein the resistor is a first resistor having a first temperature coefficients of resistance, and the semiconductor device further comprises:
a second resistor having a second temperature coefficients of resistance different than the first temperature coefficients of resistance.

25. The semiconductor device of claim 14, wherein the resistor has a temperature coefficient of resistance of −20 ppm/° C. to +20 ppm/° C.

26. The semiconductor device of claim 14, wherein the gate of the MOS transistor includes germanium, indium, antimony, or a combination thereof.

* * * * *